United States Patent
Bhattacharya et al.

(10) Patent No.: US 8,479,134 B2
(45) Date of Patent: *Jul. 2, 2013

(54) METHOD AND SYSTEM FOR SPECIFYING SYSTEM LEVEL CONSTRAINTS IN A CROSS-FABRIC DESIGN ENVIRONMENT

(75) Inventors: Utpal Bhattacharya, Noida (IN); Vikas Kohli, Noida (IN); Tarun Beri, Noida (IN); Rahul Verma, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 460 days.

This patent is subject to a terminal disclaimer.

(21) Appl. No.: 12/646,118

(22) Filed: Dec. 23, 2009

(65) Prior Publication Data

US 2011/0153289 A1    Jun. 23, 2011

(51) Int. Cl.
*G06F 17/50* (2006.01)
(52) U.S. Cl.
USPC ........... 716/116; 716/100; 716/101; 716/102; 716/117
(58) Field of Classification Search
USPC .......................... 716/137, 116–131, 100–102
See application file for complete search history.

(56) References Cited

U.S. PATENT DOCUMENTS

| | | | |
|---|---|---|---|
| 3,621,208 A | 11/1971 | Isett et al. | |
| 5,187,671 A | 2/1993 | Cobb | |
| 5,295,082 A | 3/1994 | Chang et al. | |
| 6,957,411 B1 | 10/2005 | Teig et al. | |
| 7,251,802 B2 * | 7/2007 | Hachiya et al. | 716/126 |
| 7,506,295 B1 | 3/2009 | Teig | |
| 7,765,509 B2 * | 7/2010 | Bittner et al. | 716/126 |
| 7,788,622 B2 * | 8/2010 | Petunin et al. | 716/126 |
| 7,992,121 B2 * | 8/2011 | Gupta et al. | 716/128 |
| 8,001,511 B1 * | 8/2011 | Bauer et al. | 716/117 |
| 8,082,537 B1 * | 12/2011 | Rahman | 716/137 |
| 8,112,733 B2 * | 2/2012 | Frankle et al. | 716/126 |
| 8,146,032 B2 * | 3/2012 | Chen et al. | 716/106 |
| 2002/0073380 A1 | 6/2002 | Cooke | |
| 2003/0182649 A1 | 9/2003 | Harn | |
| 2005/0240893 A1 | 10/2005 | Teig et al. | |
| 2008/0276214 A1 * | 11/2008 | Bartley et al. | 716/15 |
| 2009/0125861 A1 * | 5/2009 | Orita et al. | 716/15 |
| 2009/0125862 A1 * | 5/2009 | Nishio et al. | 716/15 |
| 2009/0178017 A1 * | 7/2009 | Gupta et al. | 716/15 |
| 2009/0288056 A1 | 11/2009 | Gitchev et al. | |

(Continued)

OTHER PUBLICATIONS

U.S. Appl. No. 12/646,042, Vikas Kohli et al.

(Continued)

*Primary Examiner* — Stacy Whitmore
(74) *Attorney, Agent, or Firm* — Holland & Knight LLP; Mark H. Whittenberger, Esq.

(57) ABSTRACT

A method of specifying system level constraints for connecting an interface of an electronic device between first and second fabrics includes specifying one or more first condition relating to a placement of the interface, specifying one or more second condition relating to a connection of a net in the interface between the first and second fabrics, generating one or more first equation expressing the first condition as a function of the location of the connectors, generating one or more second equation expressing the second condition as a function of the location of connectors, generating one or more third equation expressing an optimality criterion for the interface, and outputting the one or more first equation, the one or more second equation and the one or more third equation to a data file in a computer readable format.

32 Claims, 14 Drawing Sheets

U.S. PATENT DOCUMENTS

| | | | |
|---|---|---|---|
| 2009/0308649 A1* | 12/2009 | Cases et al. | 174/261 |
| 2010/0170083 A1* | 7/2010 | Sakata et al. | 29/593 |
| 2010/0180249 A1* | 7/2010 | Rumsey et al. | 716/12 |
| 2010/0270681 A1* | 10/2010 | Bird et al. | 257/773 |
| 2011/0035720 A1* | 2/2011 | Suiter et al. | 716/137 |
| 2011/0085313 A1* | 4/2011 | Colbert et al. | 361/803 |
| 2011/0145781 A1* | 6/2011 | Chen et al. | 716/137 |
| 2011/0153288 A1 | 6/2011 | Bhattacharya | |
| 2011/0154276 A1 | 6/2011 | Bhattacharya | |
| 2011/0210453 A1* | 9/2011 | Kusumoto et al. | 257/782 |

OTHER PUBLICATIONS

U.S. Appl. No. 12/645,988, Vikas Kohli et al.
Office Action issued in connection with U.S. Appl. No. 12/646,042, mailed Nov. 9, 2011, 9 pages.

* cited by examiner

METHOD AND SYSTEM FOR SPECIFYING SYSTEM LEVEL CONSTRAINTS IN A CROSS-FABRIC DESIGN ENVIRONMENT

BACKGROUND OF THE INVENTION

1. Field of the Invention

The embodiments of invention relate to the automation of the design and manufacturing of electronic systems, more particularly to the method and system for specifying system level constraints in a cross-fabric design environment.

2. Discussion of the Related Art

In general, an electronic system include a plurality of integrated circuit chips (IC) for performing various electronic functions. Each IC includes many electronic components (e.g. transistors, diodes, capacitors, inverters, logic gates, multiplexers, etc.) interconnected in a prescribed manner to respond to input electrical signals and produce other electrical signals according to the desired electronic function performed by the IC. For example, basic electrical components can be combined to form a larger scale component functioning as a memory cell, a multiplexer, or an arithmetic and logic unit (ALU). The various electronic components within the IC are interconnected with layers of wires made, for example, of metal and/or polysilicon.

FIG. 1 is a block diagram illustrating the interconnection of electronic components through multiple fabrics in accordance with the related art. Referring to FIG. 1, an electronic system includes one or more IC or die 140, one or more package 160 and one or more board, such as a printed circuit board (PCB) 180. Electrical signals into and out of the die 140 propagate through a plurality of pins or contact points 122 in a plurality of die buffers 120. The die 140 constitutes a first fabric for interconnecting the die buffers 120 from one IC die 140 to another IC die or other modules in the electronic system.

The die 140 is attached to a package 160, such as a ball grid array (BGA). A simple system may incorporate a single die 140 on a ball grid array (BGA) package 160. More complex system may involve multichip modules. The package 160 constitutes a second fabric through which a first buffer 120 or a module from a first die 140 is interconnected with a second buffer 120 from a second die 140 for exchanging electrical signals to be processed by the interconnected dies 140.

Conducting die bumps balls 142 are provided between the die 140 and the package 160 as electrical contacts between the die 140 and the package 160. Electrical signals from the die buffer 120 propagate through an interconnect 145 to the die bump 142. Similarly, electrical signal propagates from die bump 142 to package ball 162 through interconnect 165.

Multiple packages 160 can be attached to a PCB 180 to form a complex electronic system. These packages are routed through the PCB.

Referring to FIG. 1, a net include a first interconnect 145 for transmitting electrical signals between pin 122 of a die buffer 120 through a die 140 to a die bump 142, and a second interconnect 165 for transmitting electrical signals from the die bump 142 through the package 160 to a PCB 180 via package balls 142 and connectors 162. Thus, an electrical signal from the first die 140 on the first package 160 to a second die 140 on a second package 160 may propagate via a first net connecting the pins of the first die buffers 120 in the first die 140 through corresponding pins on the first package 160 to a first corresponding input or output pin located on the PCB 180 and via a second net connecting a second pin or connector on the PCB 180 through corresponding pins on the second package 160 to the pins of the second die 140.

A plurality of the die bumps 142 from the die 140 may be grouped to form an interface, i.e., electrical signals that are related to each other and to the function performed by the die 140. For example, the die 140 can be part of a memory module, e.g., a dual-inline memory module (DIMM). Then, a plurality of the pins 142 from the die 140 transmits digital data according to a double data rate (DDR2 or DDR3) standard. In another example, the plurality of the pins 142 from the die 140 forms a PCI express interface for communicating electrical signals to peripheral components on a computer bus in accordance to the PCI Express specification.

FIG. 2 is block diagram illustrating interconnection of interfaces across multiple fabrics. Referring to FIG. 2, an electronic system includes a first fabric 141 having a plurality of connection points 143, a second fabric 161 having a plurality of connection points 163, and a third fabric 181 having a plurality of connection points 183. Each of the fabrics 141, 161 and 181 can be one of a die, a package, a board and a field programmable gate array (FPGA). Each of the connection points 143, 163, 183 can correspond to an input or output buffer in an IC, a bump in a die, a ball in a package, or a connector of a PCB.

In FIG. 2, an exemplary 7-connection interface traverses the first fabric 141 through a first group 150 of seven of the connection points 143 in the first fabric 141. The 7-connection interface traverses the second fabric 161 through a second group 170 of seven of the connection points 163 in the second fabric 161. The 7-connection interface traverses the third fabric 181 through a third group 190 of seven of the connection points 183 in the third fabric 181. As shown in FIG. 2, the location of the connection points 143 in the first group 150 within the first fabric 141 may be different from the location of the corresponding connection points 163 in the second group 170 within the second fabric 161 and from the location of the corresponding connection points 183 in the third group 190 within the third fabric 181.

The number of connections in an interface is not limited to the exemplary number 7. The number of connections in each interface is selected based on the electrical signals to be carried through the interface. For example, an interface for transmitting bus signals in a 32-bit computer system may require 32 connections. Moreover, the number of connection points for an interface may differ across fabrics depending on design and signal requirements. For example, a 32-bit interface on a package may have 16 connection to a first die and remaining 16 connection points to a second die.

An interface net interconnects a connection point 143 from the first group 150 in the first fabric 141 through a corresponding connection point from the second group 170 in the second fabric 161 via an interconnect 145, to a corresponding connection point 183 from the third group 290 in the third fabric 181 via an interconnect 165.

Electronic systems are becoming more and more complex with many dies 140 to be positioned on a package 160, and several packages to be attached to a PCB 180. The number of interfaces and corresponding nets to be accommodated increases with the high pin count designs and the multiplicity of layers in flip-chip packaging. One of the challenges in designing such complex electronic systems is to assign an interface to corresponding groups 150, 170 and 190 of connection points across the respective fabrics 141, 161 and 181 and to assign each net of the interface to the corresponding connection points 143, 163 and 183 from the respective groups 150, 170 and 190 in the respective fabrics 141, 161 and 181.

The design of such complex electronic systems requires using a computer processing system having one or more electronic design automation application software that provides computer-based tools specifying the desired characteristics of an electronic circuit, enter circuit components to create the desired electronic circuit, interconnect the circuit components to achieve some desired logic or function, and converting the logical interconnection of the components into a layout that represents the different materials and devices that constitute the electronic circuit using geometric shapes.

The design of the electrical system shown in FIG. 2 on a computer system can be partitioned among several teams of designers to accommodate the need to reduce time to market for the product being designed and leverage the expertise of each domain. In a vertical partitioning scenario, each of the fabrics 141, 161 and 181 can be designed by a separate team of designers. For example, an IC design team can generate the placement of the die bumps 142 for IC 140. A package design team can optimize the location of the package balls 162 for interconnecting the die 140 to the package 160 and for interconnecting the package 160 with the PCB 180. A PCB design team can optimize the locations of the package balls 162 on the PCB 180.

In the related art, the PCB design may include the integration of one or more field programmable gate arrays on the PCB along with non-FPGA components to be connected to the one or more FPGA. The pin assignment is typically based on a spreadsheet. The PCB design team will generally perform pin assignment without taking into consideration the placement of the other components and the routing of the interfaces and signals on the PCB.

In the related art, the pin assignment for the FPGA and other IC modules is done manually and pin-by-pin without consideration for how the placement of the FPGA and the other IC modules might affect or be affected by the placement and routing of other components on the PCB. A design project that is unaware of the impact of other PCB components on the overall placement and routing might lead to suboptimal pin assignment resulting in an increase in the number of layers on a PCB design. Moreover, the related art approach to the electronic design project may lead to unnecessary iterations at the tail end of the design cycle because the IC design, package design and PCB design teams have to make several iterations to tweak the pin assignment in their respective fabrics.

Hence, the PCB layout designer and the package designer go back-and-forth through an increased number of iterations until the PCB layout obtains an acceptable routing of the signals from the package pins on the available layers on the PCB. The PCB designer may propose pin swapping to improve routability. Any change in the pin assignment by the package designer or the PCB designer will cause a new iteration because the schematic design has to be changed to reflect the change in pin assignment. Accordingly, the design cycle might increase by days or even weeks to account for each such iterations.

SUMMARY OF THE INVENTION

Accordingly, embodiments of the invention are directed to a method and a system for specifying system level constraints in a cross-fabric design environment that substantially obviate one or more problems due to limitations and disadvantages of the related art.

An object of embodiments of the invention is to provide a method to eliminate unnecessary physical design iterations during a connection point assignment in the design and manufacture of an electronic system.

Another object of embodiments of the invention is to provide a method for automatically assigning connection points across fabrics to an interface in a distributed manner for the design and manufacture of an electronic system.

Another object of embodiments of the invention is to provide a method for assigning an interface to connection points across in one or more fabric independently of other fabrics in an electronic system while satisfying system level constraints.

Another object of embodiments of the invention is to provide a method for performing net assignment to individual fabrics independently of other fabrics for the design and manufacture of an electronic system.

Another object of embodiments of the invention is to provide a method for assigning one or more net in an interface to connection points in one or more fabric independently of other fabrics in an electronic system while satisfying system level constraints.

Another object of embodiments of the invention is provide a method to shorten the time required to create an optimum connection point assignment in the design and manufacture of an electronic system.

Another object of embodiments of the invention is to provide a system for automatic contact point assignment in a system-aware manner across fabrics for the design and manufacture of an electronic system.

Additional features and advantages of the invention will be set forth in the description of exemplary embodiments which follows, and in part will be apparent from the description of the exemplary embodiments, or may be learned by practice of the exemplary embodiments of the invention. These and other advantages of the invention will be realized and attained by the method and system particularly pointed out in the written description of the exemplary embodiments and claims hereof as well as the appended drawings.

To achieve these and other advantages and in accordance with the purpose of the invention, as embodied and broadly described herein, a method of specifying system level constraints for connecting an interface between first and second fabrics of an electronic device, the interface having a net to be connected from one connector in the first fabric to a second connector in the second fabric, the connectors being defined by their respective location within the corresponding one of the first and second fabrics, includes: specifying one or more first condition relating to a placement of the interface within one of the first and second fabrics, specifying one or more second condition relating to a connection of the net in the interface between the first and second fabrics; generating one or more first equation expressing the first condition as a function of the location of the connectors within the one of the first and second fabrics, generating one or more second equation expressing the second condition as a function of the location of connectors within the one of the first and second fabrics, generating one or more third equation expressing an optimality criterion for the interface, and outputting the one or more first equation, the one or more second equation and the one or more third equation to a data file in a computer readable format.

In another aspect, a system for specifying system level constraints for connecting an interface between first and second fabrics of an electronic device, the interface having a net to be connected from one connector in the first fabric to a second connector in the second fabric, the connectors being defined by their respective location within the corresponding one of the first and second fabrics, includes: a first descriptor that specifies one or more first condition relating to a placement of the interface within one of the first and second fabrics, a second descriptor that specifies one or more second condition relating to a connection of the net in the interface between the first and second fabrics, and an equation generator that generates one or more first equation expressing the first condition as a function of the location of the connectors within the one of the first and second fabrics, one or more second equation expressing the second condition as a function of the location of connectors within the one of the first and second fabrics and one or more third equation expressing an optimality criterion for the interface.

In another aspect, a computer readable medium is provided for storing a set of instructions which, when executed by a computer processing system, causes the computer processing system to process input data representing locations of connectors of an interface of an electronic device to specify system level constraints for connecting a net of the interface from one connector in the first fabric to a second connector in the second fabric; the set of instructions includes a first descriptor module that cause the computer system to input one or more first condition relating to a placement of the interface within one of the first and second fabrics, a second descriptor module that causes the computer system to input one or more second condition relating to a connection of the net in the interface between the first and second fabrics, an equation generator module that causes the computer system to generate one or more first equation expressing the first condition as a function of the location of the connectors within the one of the first and second fabrics, one or more second equation expressing the second condition as a function of the location of connectors within the one of the first and second fabrics and one or more third equation expressing an optimality criterion for the interface, and a data exchanger module that outputs the one or more first equation, the one or more second equation and the one or more third equation to a data file.

Both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention.

DETAILED DESCRIPTION OF EXEMPLARY EMBODIMENTS

Reference will now be made in detail to exemplary embodiments which are illustrated in the accompanying drawings. Wherever possible, similar reference numbers will be used to refer to the same or similar parts.

Figure 1:
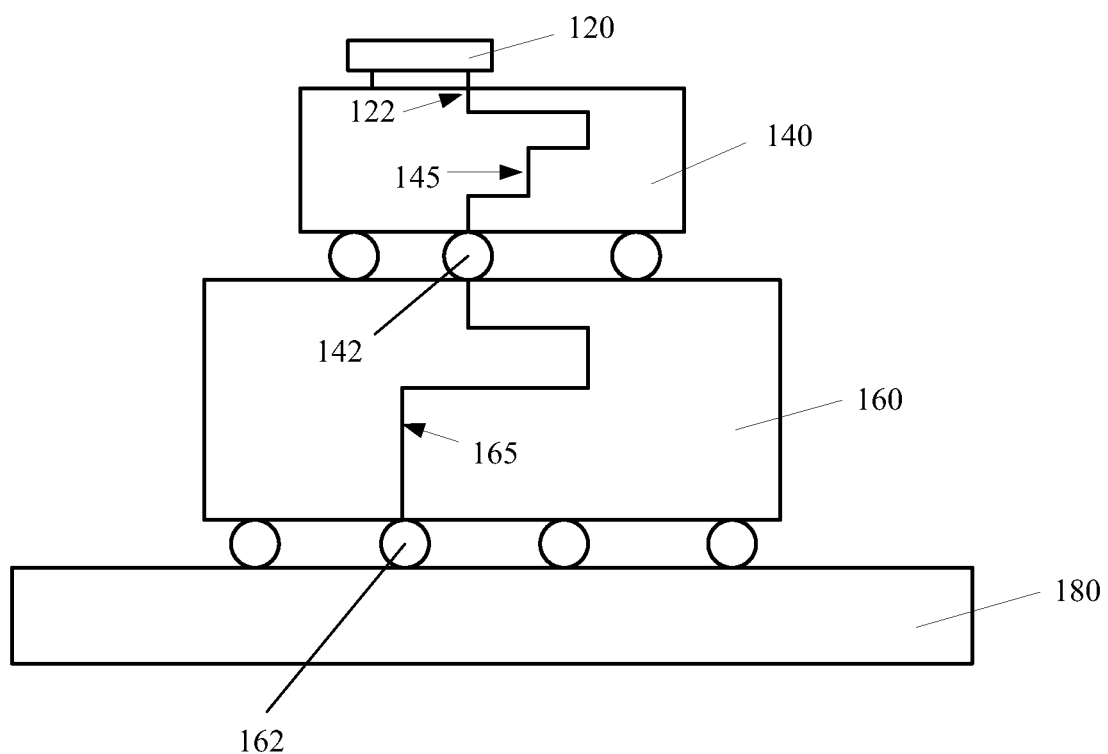
FIG. 1 is a block diagram illustrating the interconnection of electronic components through multiple fabrics in accordance with the related art.
Figure 2:
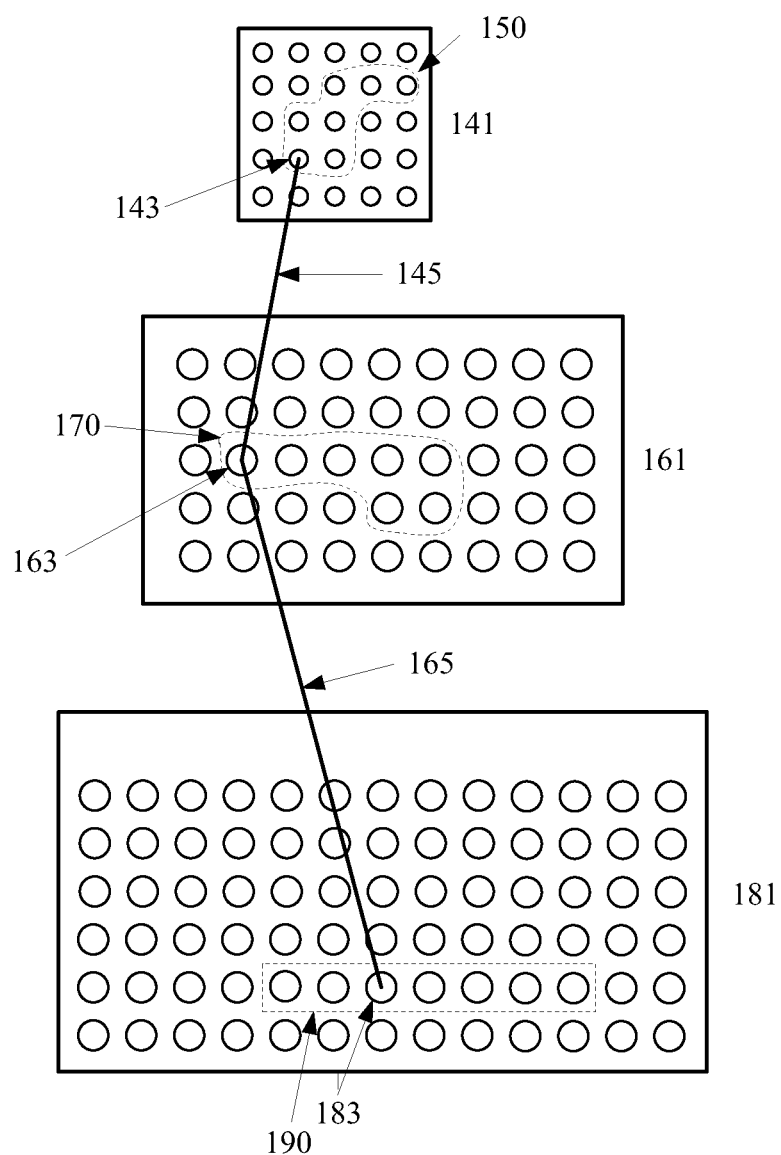
FIG. 2 is block diagram illustrating interconnection of interfaces across multiple fabrics.
Figure 3:
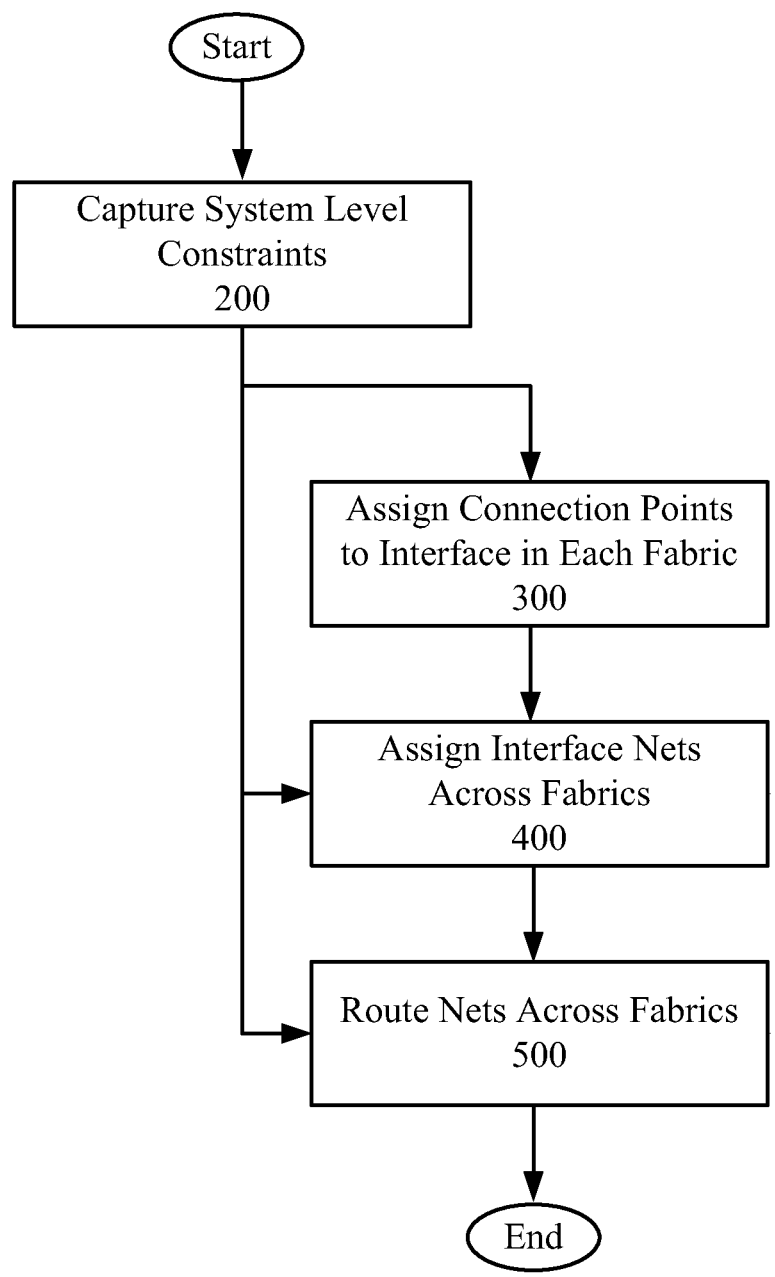
FIG. 3 shows a chart illustrating an exemplary design flow for an electronic system according to an exemplary embodiment of the invention.

FIG. 3 shows a chart illustrating an exemplary design flow for an electronic system according to an exemplary embodiment of the invention. Referring to FIG. 3, a method for designing an electronic system includes capturing system level constraints in a first stage 200, assigning connection points to each interface in one or more fabric in a second stage 300, assigning nets between connection points across fabrics in a third stage 400, and routing the nets across the fabrics in a fourth stage 500.

Figure 4:
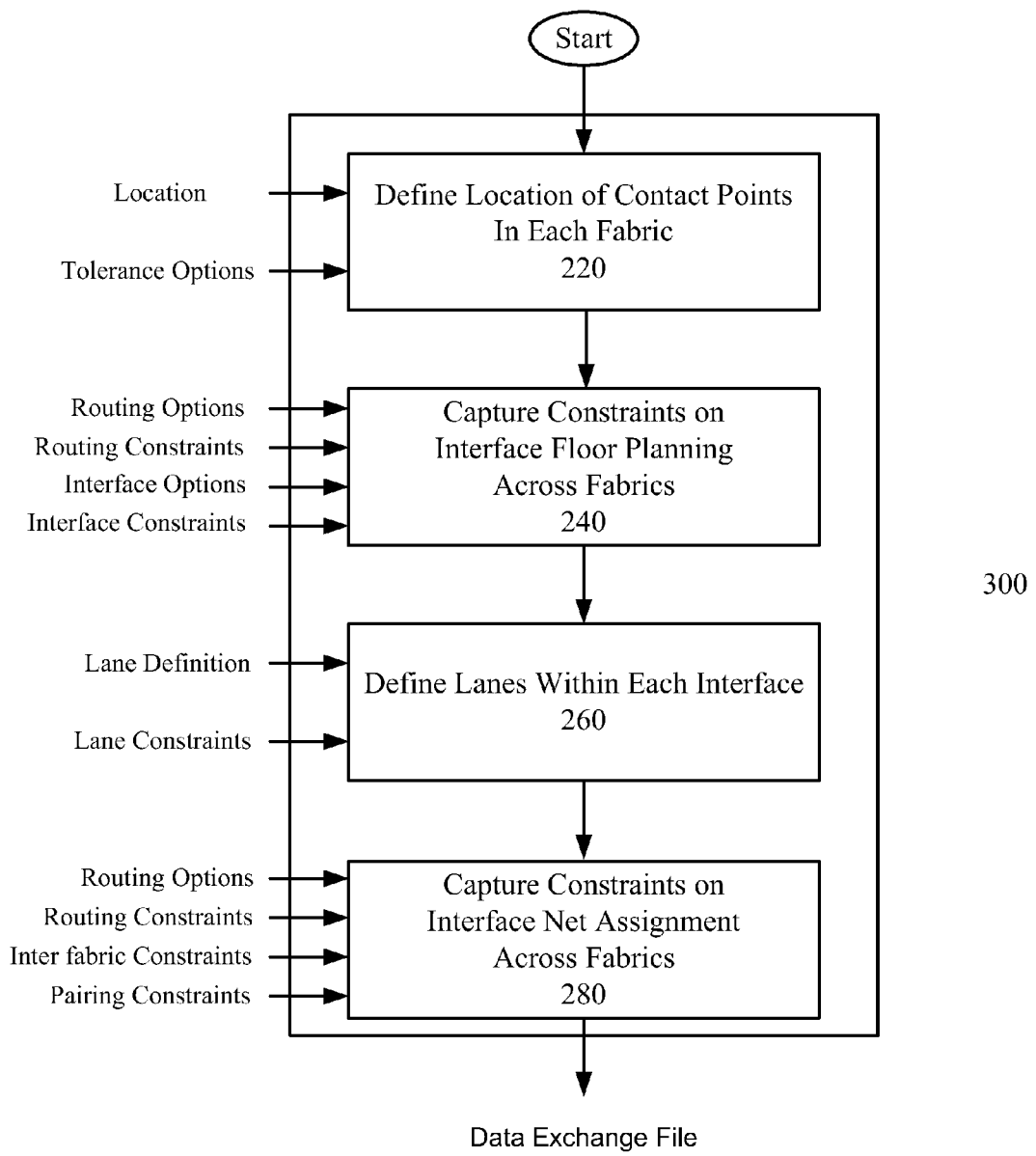
FIG. 4 shows a flow chart illustrating an exemplary design flow for capturing system level constraints for an electronic system according to an exemplary embodiment of the invention.

FIG. 4 shows a flow chart illustrating an exemplary design flow for capturing system level constraints for an electronic system according to an exemplary embodiment of the invention. Referring to FIG. 4, the locations of connection points in each fabric are inputted at a first stage 220. Each connection point can be defined by first, second and third coordinates in the corresponding fabric along three directions. A tolerance value can also be specified for each of the coordinates. The tolerance value can be selected to be the same for all three coordinates. In an exemplary embodiment, the design of the electronic system can be performed by using fixed locations for all connection points in one or more of the fabrics 141, 161 and 181. In another exemplary embodiment, the design of the electronic system can be performed by computing the best position for each connection point within the corresponding tolerance range in each fabric.

The capturing of the system level constraints includes a second stage 240 of capturing constraints on interface floor planning. In the second stage 240, the designer may specify the floor planning option for the overall system design. For example, the floor planning may be performed for all fabrics 141, 161 and 181. In another example, the floor planning may be performed on selected ones of the fabrics 141, 161 and 181. The designer also selects the optimization method at the second stage 240. The optimization method includes, for example, whether to optimize a total etch length for the electronic system, or whether to optimize the etch length of selected ones of the interfaces.

At the second stage 240, interface options are selected to specify a style for the interface floorplan at one or more of the fabrics 141, 161 and 181, such as conditions on the location of the contact points for the interface in one or more of the fabrics 141, 161 and 181. The style for the interface floorplan specifies, for example, whether the interface connections are located at the periphery of the corresponding fabric, or whether the interface will traverse the top, the bottom, the left or the right portion of the fabric. A user can also define a custom floorplan style.

Moreover, the interface constraints are specified at the second stage 240. An example of interface constraints is the propagation delay for each interface.

The capturing of the system level constraints includes a third stage 260 of defining lanes within each interface. A lane refers to a sub-interface and includes a subset or one or more of the nets in the interface. The lane represents, for example, related signals flowing together through the interface. A lane may be defined by specifying the interface within which it is located, the fabric traversed by the lane and the floorplan style for the lane in the fabric. Lane constraints can also be specified at this third stage, including a propagation delay for the lane in the electronic system.

The capturing of the system level constraints includes a fourth stage 280 of capturing constraints on interface net assignment across fabrics. The routing options for each interface net are specified in the fourth stage 280. The routing options for each interface net includes conditions on the interface net, for example, to require that the interface net be routed across all fabrics, or that the interface net be routed between a subset of the fabrics from a start fabric and to an end fabric.

A solution optimization is selected at the fourth stage 280. The solution optimization specifies whether to optimize the total etch length of the net or whether to optimize the etch length of selected ones of the nets. The solution optimization may also include specifying whether to minimize a voltage drop across fabrics.

Routing constraints are specified at the fourth stage 280 based on interface definitions. For example, the routing constraints may require that an interface net go from a specified connection point to one of a plurality of selected connection points in the next fabric.

Additional constraints specified at the fourth stage 280 include inter fabric constraints. The inter fabric constraints may include a propagation delay from a specified connection point at a start fabric to an end fabric. For example, a differential pair represents two interface nets traversing the fabrics in parallel. Thus, differential pair constraints specify pairs of connection points having substantially same propagation delay between a start fabric and an end fabric.

Referring to FIG. 3, data entry for the capturing of the system level constraints at 200 can be implemented in a graphical user interface (GUI) displayable on a computer screen. Particular entries for the constraints and options can be selected by populating pull-down menus in the GUI. The capturing of the system level constraints at 200 generates a data exchange file readable by a computer, accessible across a computer network, or distributable to various computers by portable storage means, such as a floppy disk, a USB disk or a USB memory. This allows various design teams to access the same system level constraints when designing a part of the electronic system. An example of a data exchange file for capturing system level constraints at 200 is an extensible markup language (XML) file incorporating tags and associated values for the system level constraints.

Referring back to FIG. 3, following the capturing of the system level constraints at block 200, the design of the exemplary electronic system proceeds with the assignment of connection points to each interface within each of the fabrics in accordance with design block 300. At the completion of this interface assignment stage, an interface floorplan is generated describing the location of the connection points assigned to each interface in each of the fabrics.

Figure 5:
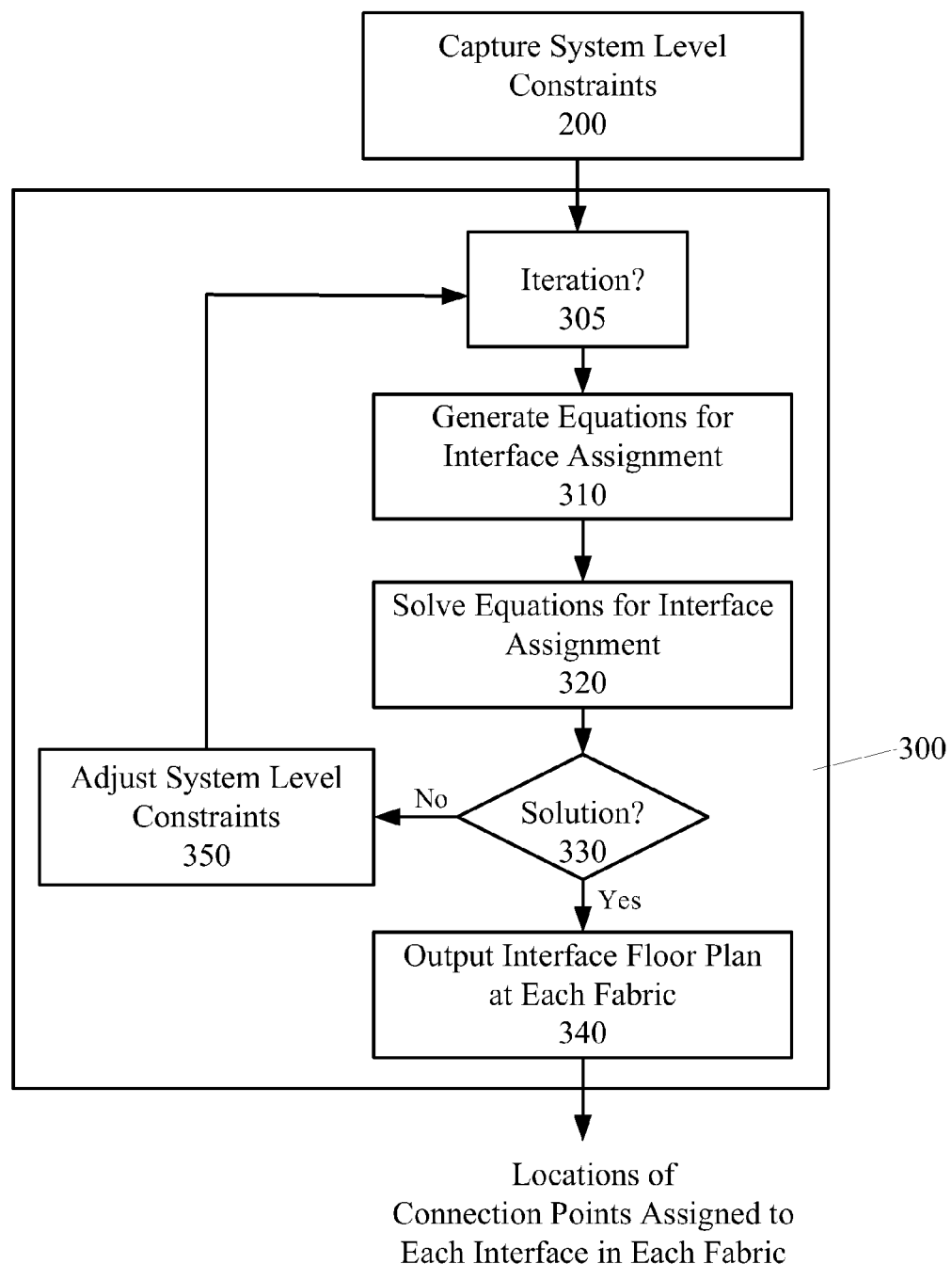
FIG. 5 shows a chart illustrating an exemplary design flow for assigning connection points to interfaces across multiple fabrics according to an exemplary embodiment of the invention.

FIG. 5 shows a chart illustrating an exemplary design flow for assigning connection points to interfaces across multiple fabrics. Referring to FIG. 5, the system level constraints generated at stage 200 of FIG. 4 are read from a data exchange file or from memory. At the first iteration 305, the system level constraints inputted at block 310 are expressed as a set of equations and inequalities describing the assignment of interfaces to connection points in each fabric. At block 320, the equations and inequalities describing the assignment of interfaces are solved using optimization equation solvers. At block 330, the results generated by the optimization equation solver are verified.

If the generated results from block 320 represent a valid solution that satisfies all the system level constraints, the interface floorplan is outputted for each fabric at block 340. For example, the locations of the contact points corresponding to each selected one of the interfaces in each fabric are stored in a database. Accordingly, the interface assignment information is accessible to multiple design teams. Thus, individual design teams can use the interface assignment information relevant to a selected one of the fabrics to complete the design of the selected fabric.

In an exemplary embodiment of the invention, an additional iteration through blocks 310 and 320 may be performed to obtain a valid solution that satisfies all the system level constraints. For example, if the generated results from block 320 do not constitute a valid solution, the system level constraints are adjusted at block 350, the number of iteration is adjusted at block 305 and another iteration is performed to generate equations for the adjusted system level constraints and solving the resulting equations to obtain a valid solution for the interface assignment across the multiple fabrics. The adjustment of system level constraints at block 350 and the iteration through blocks 310 and 320 can be repeated until a valid solution at block 330.

Figure 6:
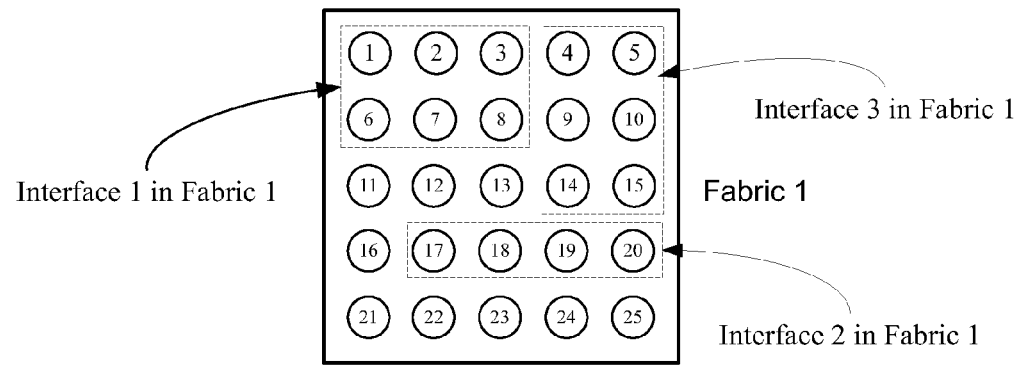
FIG. 6 illustrates an exemplary assignment of connection points to a plurality of interfaces to a plurality of fabrics in accordance with the design flow chart of FIG. 5.
Figure 6:
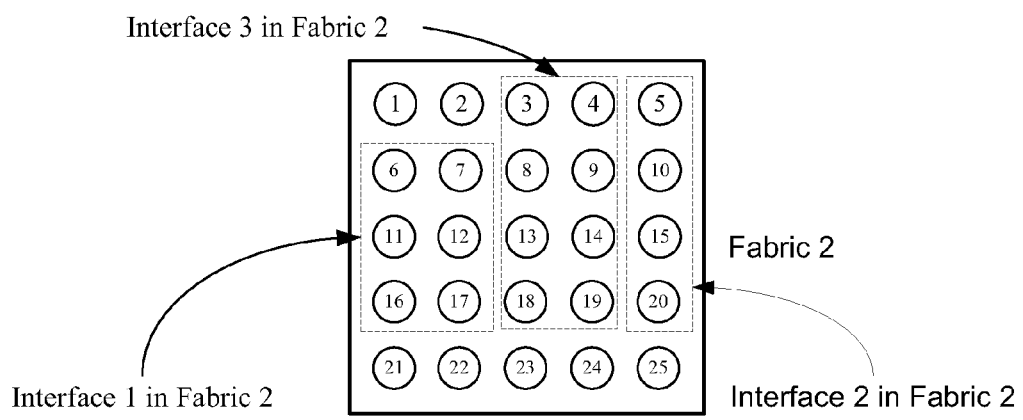
Figure 6:
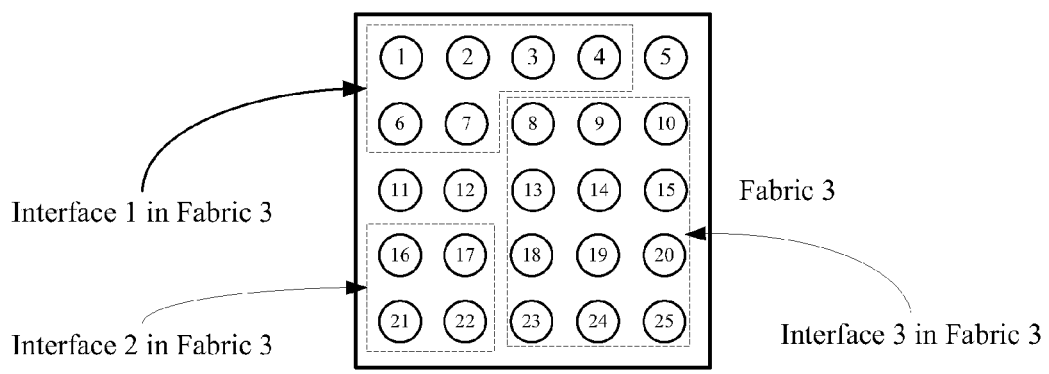

FIG. 6 illustrates an exemplary assignment of connection points to a plurality of interfaces to a plurality of fabrics in accordance with the design flow chart of FIG. 5. Referring to FIG. 6, a first exemplary interface 1 is shown with six connection points in each of fabrics 1, 2 and 3. A second exemplary interface 2 is shown with four connection points in each of fabrics 1, 2 and 3. A third interface 3 is illustrated with six connection points in fabric 1, eight connection points in fabric 2 and twelve connection points in fabric 3. The interface floorplan outputted at block 340 of FIG. 5 includes a description of the location of the contact points assigned to each of the first and second interfaces 1 and 2 in each of the fabrics. For example, at the completion of the design flow steps depicted in the flow chart of FIG. 5, the first interface 1 (shown in FIG. 6) is assigned connection points 1, 2, 3, 6, 7 and 8 in the first fabric 1, connection points 6, 7, 11, 12, 16 and 17 in the second fabric 2, and connection points 1-4, 6 and 7 in the third fabric 3. Similarly, the second interface 2 (shown in FIG. 6) is assigned connection points 17-20 in the first fabric 1, connection points 5, 10, 15 and 20 in the second fabric 2, and connection points 16, 17, 21 and 22 in the third fabric 3.

In an exemplary embodiment, the third interface 3 is assigned connection points 4, 5, 9, 10, 14 and 15 in the first fabric 1, connection points 3, 4, 8, 9, 13, 14, 18 and 19 in the second fabric 2, and connection points 8, 9, 10, 13, 14, 15, 18, 19, 20, 23, 24 and 25 in the third fabric 3. By allowing the number of connection points assigned to an interface to differ across fabrics, the method for designing an electronic system may reach faster a solution that meets the system level constraints and the optimization criteria.

In an exemplary embodiment of the invention, a boolean variable $P_{i\_I\_F}$ is assigned indicating whether an i-numbered connection point belongs in an I-numbered interface in an F-numbered fabric. The boolean variable $P_{i\_I\_F}=1$ if the I-numbered interface traverses the fabric F at the i-numbered connection point and $P_{i\_I\_F}=0$ otherwise. For example, in the first fabric 1, the boolean values $P_{1\_1\_1}=1$, $P_{2\_1\_1}=1$, $P_{3\_1\_1}=1$, $P_{6\_1\_1}=1$, $P_{7\_1\_1}=1$ and $P_{8\_1\_1}=1$ indicate an assignment of the connection points 1, 2, 3, 6, 7 and 8 to interface 1 in fabric 1. Similarly, in the second fabric 2, the boolean values $P_{6\_1\_2}=1$, $P_{7\_1\_2}=1$, $P_{11\_1\_2}=1$, $P_{12\_1\_2}=1$, $P_{16\_1\_2}=1$ and $P_{17\_1\_2}=1$ represent an assignment of the connection points 6, 7, 11, 12, 16 and 17 to interface 1 in fabric 1

In an exemplary embodiment of the invention, the assignment of a group of i-numbered connection points in an F-numbered fabric to an I-numbered interface can be based on an evaluation of one or more numerical expression representing one or more condition on the location of the i-numbered connection points as a function of a function of the value of the boolean variable $P_{i\_I\_F}$ at the i-numbered connection point in the group within the F-numbered fabric. For example, a condition on the interface floor planning in accordance with design block 240 from FIG. 4 can be represented by a function of the value boolean variable $P_{i\_I\_F}$ at each possible i-numbered connection point in the F-numbered fabric.

An example of a condition on the location of connection points is a floorplan style. The constraints captured at block 240 of FIG. 4 may specify that an I-numbered interface be positioned at fabric periphery only in an F-numbered fabric. For this specific floorplan style, the value of the boolean variable $P_{i\_I\_F}$ is 0 at each of the i-numbered connection points except for the connection points located at the periphery of the F-numbered fabric. For instance, to constraint interface 2 to the periphery of fabric 2, as illustrated in FIG. 6, the boolean variable $P_{i\_I\_F}$ is given a value of 0 at each of connection points 7-9, 12-14 and 17-19.

Thus, according to an exemplary embodiment of the invention, a condition on the location of the connections can be represented by a set of boolean equations $P_{i\_I\_F}=0$, each equation corresponding to an i-numbered connection in the F-numbered fabric.

Another example of a condition on the assignment of connection points to interfaces is the floor planning option. One option is to perform the floor planning for all the fabrics. Another option is to perform the floor planning only on selected fabrics. The more fabrics are selected, the larger the number of equations to be generated to represent the options and constraints on the fabrics.

Still another example of a condition on the assignment of connection points is a constraint on the number $N_I$ of connection points in the I-numbered interface. In an exemplary embodiment of the invention, the constraint on the number $N_I$ of connection points in the I-numbered interface can be represented by a pseudo-boolean equation of the value of boolean variable $P_{i\_I\_F}$ evaluated at each of the i-numbered connection points in the F-numbered fabric. For example, the number $N_I$ of connection points in the I-numbered interface through the F-numbered fabric satisfies pseudo-boolean Equation 1, below:

$$P_{1\_I\_F}+P_{2\_I\_F}+P_{3\_I\_F}+\ldots+P_{C\_I\_F}=N_I \quad \text{(Equation 1)}$$

In Equation 1, the number C represents the total number of connection points in the fabric F. An I-number of Equations 1 will suffice to describe the number of connection points assigned to the corresponding I-numbered interfaces. For example, in the exemplary embodiment shown in FIG. 6 with two interfaces 1 and 2, two equations in the form of Equation 1 will suffice to describe the number of connection points in the corresponding interfaces 1 and 2.

Yet another condition on the assignment of connection points to interfaces across the fabrics is a system level constraint that no connection point in any fabric can belong to more than one interface. In accordance with this system level constraint, the boolean variable $P_{i\_I\_F}$ specifying whether an i-numbered connection point belongs in a I-numbered interface can have a value of 1 for at most one of the interfaces in each fabric. Hence, for each i-numbered connection point in a fabric F, the following pseudo-boolean inequality is satisfied:

$$P_{i\_1\_F}+P_{i\_2\_F}+\ldots+P_{i\_I\_F}\leq 1 \quad \text{(Equation 2)}$$

For example, a 25-connection point fabric requires 25 such inequalities to represent the condition that no i-numbered connection point can belong to more than one interface I.

Additional conditions can be imposed on the location of the connection points within each F-numbered fabric to impose a particular shape on the group of connection points assigned to an interface in a fabric. In an exemplary embodiment of the invention, all the connection points to be assigned to an interface can be selected within a contiguous region of the corresponding fabric. This constraint prevents a scattering of the connection points across the fabric. Thus, the connection points assigned to each interface are close together in each of the fabrics.

An example of a condition that constrains the shape of the group of connection points assigned to an interface is to require that there is one and exactly one connection point in the group of connection points which does not have any higher numbered horizontally or vertically adjacent connection point in the same interface within the fabric. For example, in FIG. 6 connection point 8 in fabric 1 is the only connection point in interface 1 that does not have any higher numbered horizontally or vertically adjacent connection point in interface 1. Similarly, connection point 17 in fabric 2 is the only connection point in interface 1 that does not have any higher numbered horizontally or vertically adjacent connection point in interface 1. Thus, the assignment of connection points 1-3 and 6-8 to interface 1 in the first fabric 1 is a valid assignment. Similarly, the assignment of connection points 6-7, 11-12 and 16-17 to interface 1 in the second fabric 2 is a valid assignment.

In another exemplary embodiment, a group of connection points that do not satisfy the condition on the number of connection points having higher numbered horizontally or vertically adjacent connection point may not be assigned to an interface. Thus, such a group of connection points may include more than one connection point which does not have any higher numbered horizontally or vertically adjacent connection point in the same interface. For example, in the third fabric 3 shown in FIG. 6, each of connection points 4 and 7 does not have any higher numbered horizontally or vertically adjacent connection point in interface 1. Thus, the assignment of connection points 1-4 and 6-7 to interface 1 in the third fabric 3 may not be allowed in another embodiment of the invention.

Thus, according to an exemplary embodiment of the invention, a condition can be imposed on the number of connection points having higher numbered horizontally or vertically adjacent connection point in an interface to constrain the shape of the interface within a fabric. The condition on the number of connection points having higher numbered horizontally or vertically adjacent connection point in the interface in a specified fabric can also be represented by one or more equation depending on one or more boolean variables. For example, a second boolean variable $S_{i\_I\_F}$ takes a value of 1 to indicate that an i-numbered connection point in the I-numbered interface of fabric F has no higher numbered horizontally or vertically adjacent connection points in the I-numbered interface of fabric F. The boolean variable $S_{i\_I\_F}$ is assigned a value of 0 otherwise. Thus, for the 25-connection point fabric shown in FIG. 6 with two interfaces 1 and 2, $S_{1\_1\_1}+S_{2\_1\_1}+S_{3\_1\_1}+\ldots+S_{25\_1\_1}=1$ and $S_{1\_2\_1}+S_{2\_2\_1}+S_{3\_2\_1}+\ldots+S_{25\_2\_1}=1$. In general, for an I-number of interfaces, the condition on the number of higher numbered connection point is expressed using an I-number of equations for each interface F in the form:

$$S_{1\_I\_F}+S_{2\_I\_F}+S_{3\_I\_F}+\ldots+S_{25\_I\_F}=1 \quad \text{(Equation 3)}$$

$S_{i\_I\_F}=1$ only if $P_{i\_I\_F}=1$ because the second boolean variable $S_{i\_I\_F}$ can take a value of 1 only if the i-numbered connection point is in the I-numbered interface of fabric F.

Figure 7:
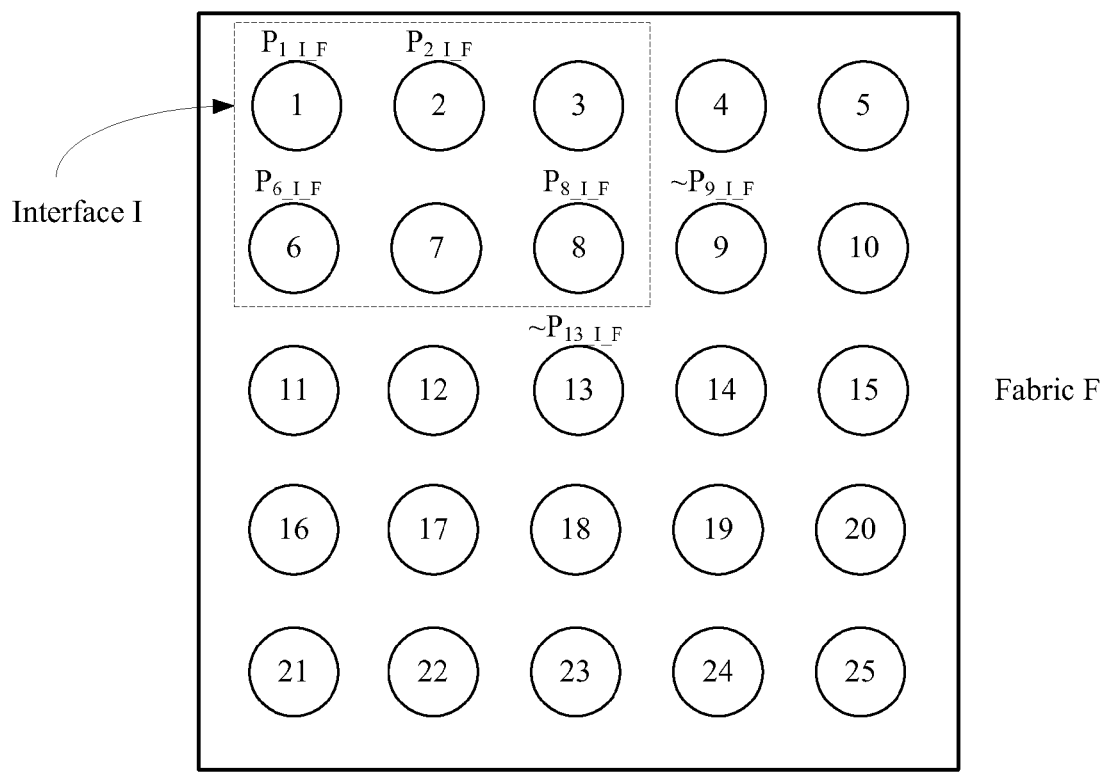
FIG. 7 illustrates the assignment of boolean variables to adjacent connection points in a fabric according to an exemplary embodiment of the invention.

FIG. 7 illustrates the assignment of boolean variables to adjacent connection points in a fabric according to an exemplary embodiment of the invention. Referring to FIG. 7, a connection point 8 in fabric F has a first horizontally adjacent connection point 9 and a second vertically adjacent connection point 13. The corresponding boolean variable associating the connection points 8, 9 and 13 to interface I in fabric F are $P_{8\_I\_F}$, $P_{9\_I\_F}$, and $P_{13\_I\_F}$, respectively. The corresponding boolean variable constraining the higher-numbered connection points adjacent to connection point 8 in interface I in fabric F is $S_{8\_I\_F}$. If the connection point 8 does not to have any higher numbered horizontally or vertically adjacent connection points in the I-numbered interface of fabric F, neither connection point 9 nor 13 can be assigned to interface I when connection point 8 is assigned to the interface I. In an exemplary embodiment, the corresponding constraint for connection point 8 to represent a valid assignment in interface I of fabric F is formulated in the following non-linear pseudo-boolean equation:

$$S_{8\_I\_F}=P_{8\_I\_F}(\sim P_{9\_I\_F})(\sim P_{13\_I\_F}) \quad \text{(Equation 4)}$$

The pseudo-boolean product in Equation 4 can be expressed in linear form as a set of 2 pseudo-boolean inequalities:

$$P_{8\_I\_F}+(\sim P_{9\_I\_F})+(\sim P_{13\_I\_F})-S_{8\_I\_F}<3 \quad \text{(Equation 5)}$$

$$P_{8\_I\_F}+(\sim P_{9\_I\_F})+(\sim P_{13\_I\_F})-3S_{8\_I\_F}\geq 0 \quad \text{(Equation 6)}$$

In Equations 5 and 6, the ~operator refers to the boolean complement operator such that $(\sim 1)=0$ and $(\sim 0)=1$.

In an exemplary embodiment of the invention as shown in FIG. 5, an inequality, e.g. Equation 5, is generated for each of the connecting point in each of the fabrics and each of the interfaces by subtracting the second boolean variable $S_{8\_I\_F}$ evaluated at the connecting point from an arithmetic sum of the first boolean variable $P_{8\_I\_F}$ evaluated at the connecting point, the complement $(\sim P_{9\_I\_F})$ of the first boolean variable evaluated at the horizontally adjacent connecting point, and the complement $(\sim P_{13\_I\_F})$ of the first boolean variable evaluated at the vertically adjacent connecting point. Another inequality, e.g. Equation 6, is generated for each of the connecting point in each fabric by subtracting a three-multiple of the second boolean variable $S_{8\_I\_F}$ evaluated at the connecting point from the arithmetic sum $P_{8\_I\_F}+(\sim P_{9\_I\_F})+(\sim P_{13\_I\_F})$.

According to an exemplary embodiment of the invention, the first and second inequalities expressed in Equations 5 and 6 are solved to assign each of the interfaces to a corresponding plurality of connectors in each of the fabrics such that the second Boolean variable $S_{8\_I\_F}$ has a non-zero value at exactly one of the corresponding plurality of connectors in any of the fabrics. The Equations 5 and 6 can be solved, for example, using a pseudo-boolean equation solver.

According to another exemplary embodiment of the invention, one or more of Equations 1-3 and 5-6 is solved to assign each of the interfaces to a corresponding plurality of connectors in each of the fabrics in accordance with one or more desired system level constraint on the assignment of interfaces. The one or more of Equations 1-3 and 5-6 can be solved at block 320 of FIG. 5 using a pseudo-boolean equation solver.

Additional conditions can be imposed on the location of the connection points within each F-numbered fabric to prevent a scattering of the connection points across the fabric by generating appropriate equations to express the additional conditions. In another example, connection points assigned to an interface can be constrained to be horizontally or vertically adjacent. In still another example, the connection points can be constrained to fall on a selected diagonal in one of the fabrics.

Figure 8A:
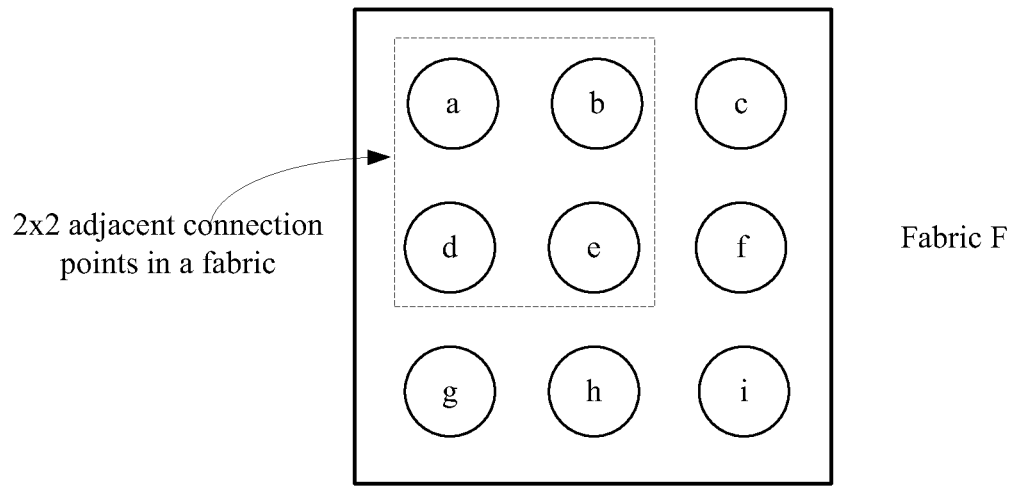
FIG. 8A shows an example of four connection points in a 2×2 portion of a fabric.

FIG. 8A shows an example of four connection points in a 2×2 portion of a fabric. Two of the connection points in such a 2×2 portion of a fabric F can be assigned to an interface I such that the two connection points are both in the same row or the same column. This condition ensures that each connector in the interface within one of the first and second fabrics is horizontally or vertically adjacent to another connector in the interface within the one of the first and second fabrics. Thus, the condition ensures that no connector be assigned to the interface without the adjacent connector thereto. To assign two of the connection points a, b, d and e from fabric F to an interface I with the above condition, a set of six equations is required for the selected 2×2 portion of the fabric F:

$$P_{a\_I\_F} \vee P_{b\_I\_F} \vee P_{d\_I\_F}=1 \quad \text{(Equation 7)}$$

$$P_{b\_I\_F} \vee P_{e\_I\_F} \vee P_{d\_I\_F}=1 \quad \text{(Equation 8)}$$

$$P_{a\_I\_F} \vee P_{d\_I\_F} \vee P_{e\_I\_F}=1 \quad \text{(Equation 9)}$$

$$P_{a\_I\_F} \vee P_{b\_I\_F} \vee P_{e\_I\_F}=1 \quad \text{(Equation 10)}$$

$$(\sim P_{a\_I\_F}) \vee (\sim P_{c\_I\_F})=1 \quad \text{(Equation 11)}$$

$$(\sim P_{b\_I\_F}) \vee (\sim P_{d\_I\_F})=1 \quad \text{(Equation 12)}$$

Thus, in an exemplary embodiment, connection points assigned to an interface can be constrained to be horizontally or vertically adjacent in a 2×2 portion of a fabric F by generating the above Equations 7-12 for any desired 2×2 portion of the fabric F. As set forth herein, the ~ operation refers to the complement operation and the ∨ operation refers to the boolean "OR" operation.

Figure 8B:
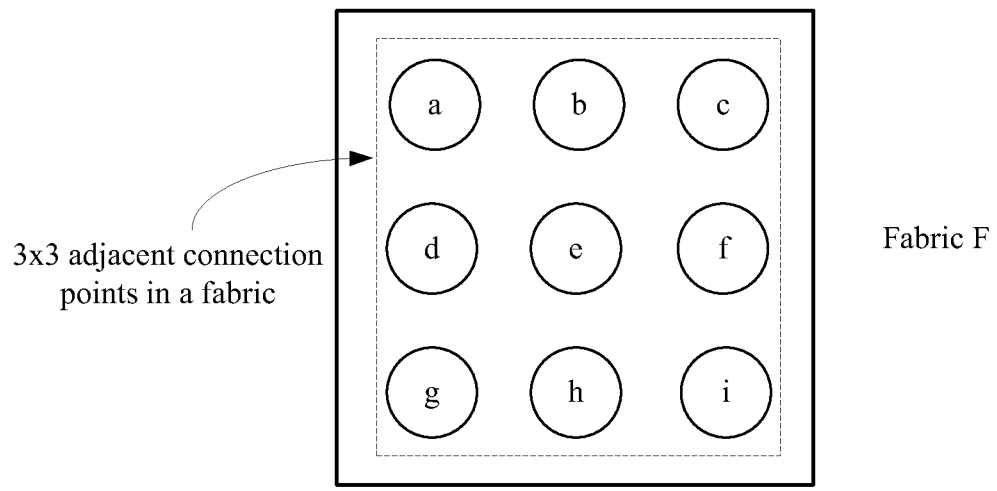
FIG. 8B shows an example of nine connection points in a 3×3 portion of a fabric.

FIG. 8B shows an example of nine connection points in a 3×3 portion of a fabric. Two or more of the connection points in such a 3×3 portion of a fabric F can be assigned to an interface I such that at least one diagonal connection point and one non-diagonal connection point are assigned to the interface I in the 3×3 portion of the fabric F. For example, to assign two or more of the connection points from the fabric F to the interface I with the above condition, a set of two boolean equations is required for the selected 3×3 portion of the fabric F:

$$P_{a\_I\_F} \vee P_{e\_I\_F} \vee P_{i\_I\_F} \vee P_{c\_I\_F} \vee P_{g\_I\_F} = 1 \quad \text{(Equation 13)}$$

$$P_{b\_I\_F} \vee P_{f\_I\_F} \vee P_{d\_I\_F} \vee P_{h\_I\_F} = 1 \quad \text{(Equation 14)}$$

Thus, in an exemplary embodiment, connection points assigned to an interface can be constrained to include at least one diagonal connection point and one non-diagonal connection point in a 3×3 portion of the fabric F by generating the above Equations 13 and 14 for any desired 3×3 portion of the fabric F.

Still referring to FIG. 8B, connection points from a 3×3 portion of a fabric F can be assigned to an interface I such that at exactly one diagonal connection point and no more than two non-diagonal connection points are assigned to the interface I in the 3×3 portion of the fabric F. For example, to assign the connection points from the 3×3 portion of the fabric F to the interface I with the above condition, a set of two pseudo-boolean equations is required for the selected 3×3 portion of the fabric F:

$$P_{a\_I\_F} + P_{e\_I\_F} + P_{i\_I\_F} + P_{c\_I\_F} + P_{g\_I\_F} = 1 \quad \text{(Equation 15)}$$

$$P_{b\_I\_F} + P_{f\_I\_F} + P_{d\_I\_F} + P_{h\_I\_F} \leq 2 \quad \text{(Equation 16)}$$

Thus, in another exemplary embodiment, connection points assigned to an interface can be constrained to include exactly one diagonal connection point and no more than two non-diagonal connection points in a 3×3 portion of the fabric F by generating the above Equations 15 and 16 for any desired 3×3 portion of the fabric F.

In Equation 16 above, the relationship between the non-diagonal connection points can be interpreted as a cost on the assignment of the non-diagonal connection points to the interface I. For example, Equation 16 may represent a total cost of less than 2 for assigning no more than two non-diagonal connection points to an interface within a fabric. Thus, Equation 16 associates a cost of 1 for the assignment of each non-diagonal connection point to an interface in a fabric.

In an exemplary embodiment, a specific cost may be associated with the assignment of a connection point in a fabric to an interface. For example, the cost of assigning an i-numbered connection point to an I-numbered interface in an F-numbered fabric can be expressed as $C_{i\_I\_F}$. Then, a maximum total cost C for assigning non-diagonals connection points from a 3×3 portion of a fabric to an interface can be represented by the expression:

$$C_{b\_I\_F}P_{b\_I\_F} + C_{f\_I\_F}P_{f\_I\_F} + C_{d\_I\_F}P_{d\_I\_F} + C_{h\_I\_F}P_{h\_I\_F} < C \quad \text{(Equation 17)}$$

Thus, according to still another exemplary embodiment of the invention, connection points assigned to an interface can be constrained such that the cost of assigning non-diagonal connection points from a 3×3 portion of the fabric F to an I-numbered interface be less than a specified value C based on system level constraints by generating Equation 17 for any desired 3×3 portion of the fabric F where the condition is desired to be applied.

In an exemplary embodiment, an optimization criterion can be formulated based on a minimization of the total cost for assigning non-diagonals connection points from a 3×3 portion of a fabric to an interface. The minimization of the total cost for assigning non-diagonal connection points in any 3×3 portion of a fabric can be formulated as:

$$\text{Min}\{C_{b\_I\_F}P_{b\_I\_F} + C_{f\_I\_F}P_{f\_I\_F} + C_{d\_I\_F}P_{d\_I\_F} + C_{h\_I\_F}P_{h\_I\_F}\} \quad \text{(Equation 18)}$$

Thus, in an exemplary embodiment, connection points assigned to an interface can be constrained such that the cost of assigning non-diagonal connection points from a 3×3 portion of the fabric F to an I-numbered interface can be the lowest possible by minimizing the optimization criterion of Equation 18 for any desired 3×3 portion of the fabric F where the optimization criterion is required.

According to an exemplary embodiment of the invention, a plurality of the Equations 1-3 and 5-17 is solved to assign each of the interfaces to a corresponding plurality of connectors in each of the fabrics by finding a solution of the Equations 1-3 and 5-17 that minimizes a total cost of assigning non-diagonal connection points to the interface in accordance with the optimization criterion of Equation 18. The plurality of the Equations 1-3 and 5-17 subject to the optimization criterion of Equation 18 can be solved at block 320 of FIG. 5 using a pseudo-boolean equation solver.

According to another exemplary embodiment of the invention, a plurality of the Equations 1-3 and 5-17 is solved at block 320 in FIG. 5 to assign each of the interfaces to a corresponding plurality of connection points in each of the fabrics in accordance with desired system level constraints on the assignment of interfaces including, for example, a constraint on interface delay or a constraint on interface length. For example, a constraint might require a total etch length of the interfaces to be less than a maximum specified value. In another example, a constraint may require the etch length of one or more interface to be less than a maximum specified value. In a further example, a propagation delay from any connection point in one interface in the first fabric to any connection point in the interface in the second fabric, and possibly to any connection point in the interface in the third fabric to be less than a specified value.

The length $L^{1,2}_{i\_j}$ between connection point i in fabric 1 and connection point j in fabric 2 can be measured, for example, using a Manhattan distance between the connection point i in fabric 1 and connection point j in fabric 2. Similarly, the length $L^{2,3}_{j\_k}$ between connection point j in fabric 2 and connection point k in fabric 3 can be measured by the Manhattan distance between connection point j in fabric 2 and connection point k in fabric 3. In an embodiment, the lengths $L^{1,2}_{i\_j}$ and $L^{2,3}_{j\_k}$ of between the corresponding connection points can be measured by any other means including using an Euclidian distance between connection points i in fabric 1 and connection point j in fabric 2, and the Euclidian distance between connection point j in fabric 2 and connection point k in fabric 3.

A length of any I-numbered interface can be represented by an average of the individual calculated lengths between corresponding connection points in the I-numbered interface. In an embodiment, the length of an I-numbered interface is the arithmetic mean of the lengths between corresponding connection points in the I-numbered interface. In an another embodiment, the length of an I-numbered interface is the median of the lengths between corresponding connection points in the I-numbered interface. In yet another embodiment, the length of an I-numbered interface is the maximum of the lengths between corresponding connection points in the I-numbered interface. It is to be understood that the propagation delay for an interface is related to the length of the interface. Thus, the length of an I-numbered interface can also represent the propagation delay for the I-numbered interface.

According to an exemplary embodiment of the invention, a constraint on the length of the interface can be represented by one or more equations relating a boolean variable to the length of interface measured between connection points across the fabrics. For example, referring back to FIG. 6, a third boolean variable $T_{i\_j\_k\_I}$ is assigned a value of 1 if the i-numbered connection point in fabric 1, the j-numbered connection point in fabric 2 and the k-numbered connection point in fabric 3 are all assigned to the I-numbered interface. Using this representation, the boolean variable T evaluates to $T_{17\_5\_16\_2}=1$, $T_{17\_10\_16\_2}=1$ and $T_{18\_10\_16\_2}=1$, for example, in reference to FIG. 6. Using the third boolean variable, the length of an assignment of the i-numbered connection point in fabric 1, the j-numbered connection point in fabric 2 and the k-numbered connection point in fabric 3 to the I-numbered interface is represented by a pseudo-boolean expression in the form $(L^{1,2}_{i\_j}+L^{2,3}_{j\_k})\,T_{i\_j\_k\_I}$. Thus, the constraint relating to an interface delay constraint or an interface length can be expressed as a pseudo-boolean inequality:

$$(L^{2,3}_{i\_j}+L^{2,3}_{j\_k})T_{i\_j\_k\_I} \leq M_I \quad \text{(Equation 19)}$$

In Equation 19, $M_I$ represents a maximum interface length for interface I in accordance with an interface constraint specified by the system level constraints captured in design block 200 of FIG. 4. In an exemplary embodiment of the invention, to impose an interface length constraint or interface delay constraint on the assignments of connection points i, j and k to interface I in fabrics 1, 2 and 3 respectively, Equation 19 is generated for each i-numbered connection point in fabric 1, each j-numbered connection point in fabric 2 and each k-numbered connection point in fabric 3, and for each I-numbered interface having a propagation delay constraint or an interface length constraint.

The value of the third boolean variable $T_{i\_j\_k\_I}$ is related to the first boolean variable $P_{i\_I\_F}$ evaluated at the respective fabrics. When $T_{i\_j\_k\_I}$ is equal to 1, the i-numbered connection point in fabric 1, the j-numbered connection point in fabric 2 and the k-numbered connection point in fabric 3 are all assigned to the I-numbered interface. Thus, $P_{i\_I\_1}=1$, $P_{j\_I\_2}=1$ and $P_{i\_I\_3}=1$. The relation between the third boolean variable $T_{i\_j\_k\_I}$ and the first boolean variable $P_{i\_I\_F}$ is expressed by two additional pseudo-boolean inequalities:

$$P_{i\_I\_1}+P_{j\_I\_2}+P_{k\_I\_3}-T_{i\_j\_k\_1}<3 \quad \text{(Equation 20)}$$

$$P_{i\_I\_1}+P_{j\_I\_2}+P_{k\_I\_3}-3T_{i\_j\_k\_I} \geq 0 \quad \text{(Equation 21)}$$

In an exemplary embodiment of the invention, the third, fourth and fifth inequalities expressed in Equations 19, 20 and 21 respectively, are solved to assign each of the interfaces to a corresponding plurality of connection points such that the connection points satisfy a constraint on the length of the interface including, for example, an interface delay constraint or a maximum etch length constraint. The Equations 19, 20 and 21 can be solved, for example, using a pseudo-Boolean equation solver.

According to an exemplary embodiment of the invention, one or more of Equations 1-3, 5-17 and 19-21 is solved to assign each of the interfaces to a corresponding plurality of connection points in each of the fabrics in accordance with one or more system level constraints on the assignment of interfaces. The one or more of Equations 1-3, 5-17 and 19-21 can be solved at block 320 of FIG. 5 using a pseudo-boolean equation solver.

According to another exemplary embodiment of the invention, one or more of Equations 1-3, 5-17 and 19-21 is solved at block 320 in FIG. 5 to assign each of the interfaces to a corresponding plurality of connectors in each of the fabrics in accordance with desired system level constraints on the assignment of interfaces subject to an optimization criterion. For example, the one or more of Equations 1-3, 5-17 and 19-21 can be solved to minimize the total length of the interfaces subject to the constraints expressed by the one or more of Equations 1-3, 5-17 and 19-20. In another example, the one or more of Equations 1-3, 5-17 and 19-21 can be solved to minimize an etch length of one or more of the interfaces subject to the constraints expressed by the one or more of Equations 1-3, 5-17 and 19-21. In a further example, the one or more of Equations 1-3, 5-17 and 19-21 can be solved to minimize a propagation delay from any connection point in one or more of the interfaces in the first fabric to any connection point in the interface in the second fabric, and possibly to any connection point in the interface in the third fabric, subject to the constraints expressed by the one or more of Equations 1-3, 5-17 and 19-21. The one or more of Equations 1-3, 5-17 and 19-21 can be solved using a pseudo-boolean equation solver subject to the optimality criterion.

In an exemplary embodiment, fabric 1 has an l-number of connection points, fabric 2 has an m-number of connection points, and fabric 3 has an n-number of connection points. Then, the optimization criterion for minimizing the length of an I-numbered interface can be formulated as a minimization of the following triple summation:

$$\text{Min}\left\{\sum_{k=1}^{n}\sum_{j=1}^{m}\sum_{i=1}^{l}(L^{1,2}_{i\_j}+L^{2,3}_{j\_k})T_{i\_j\_k\_I}\right\} \quad \text{(Equation 22)}$$

Similarly, the optimization criterion for minimizing the length of interfaces 1 and 2 can be formulated as a minimization of the following triple summation:

$$\text{Min}\left\{\sum_{k=1}^{n}\sum_{j=1}^{m}\sum_{i=1}^{l}(L^{1,2}_{i\_j}+L^{2,3}_{j\_k})T_{i\_j\_k\_1} + \sum_{k=1}^{n}\sum_{j=1}^{m}\sum_{i=1}^{l}(L^{1,2}_{i\_j}+L^{2,3}_{j\_k})T_{i\_j\_k\_2}\right\} \quad \text{(Equation 23)}$$

In another exemplary embodiment, the optimization criterion can be extended to any number of interfaces by adding more and more triple summation expressions to the optimization criterion expressed in Equation 23.

Referring back to FIG. 5, after the solution to the equations has been found at block 320 and verified at the verification step 330, the interface floorplan information is outputted at block 340. The system interface floorplan can be outputted, for example, to a data exchange file or a database to be stored in a storage means on the computer system, such as a hard disk, a floppy disk, a USB disk or a USB memory. For example, the locations of the contact points corresponding to each selected one of the interfaces in each fabric are stored in a database. This allows the various design teams to access the system interface floorplan when designing any part of the electronic system. Thus, individual design teams can use the interface assignment information relevant to a selected one of the fabrics to complete the design of the selected fabric.

Referring back to FIG. 3, following the capturing of the system level constraints in accordance with design block 200 and the assignment of connection points to each interface within each of the fabrics in accordance with design block 300, nets are assigned to connection points across the fabrics in accordance with design block 400. At the completion of this net assignment stage, the location of connection points corresponding to each net of each interface is specified in each of the fabrics.

Figure 9:
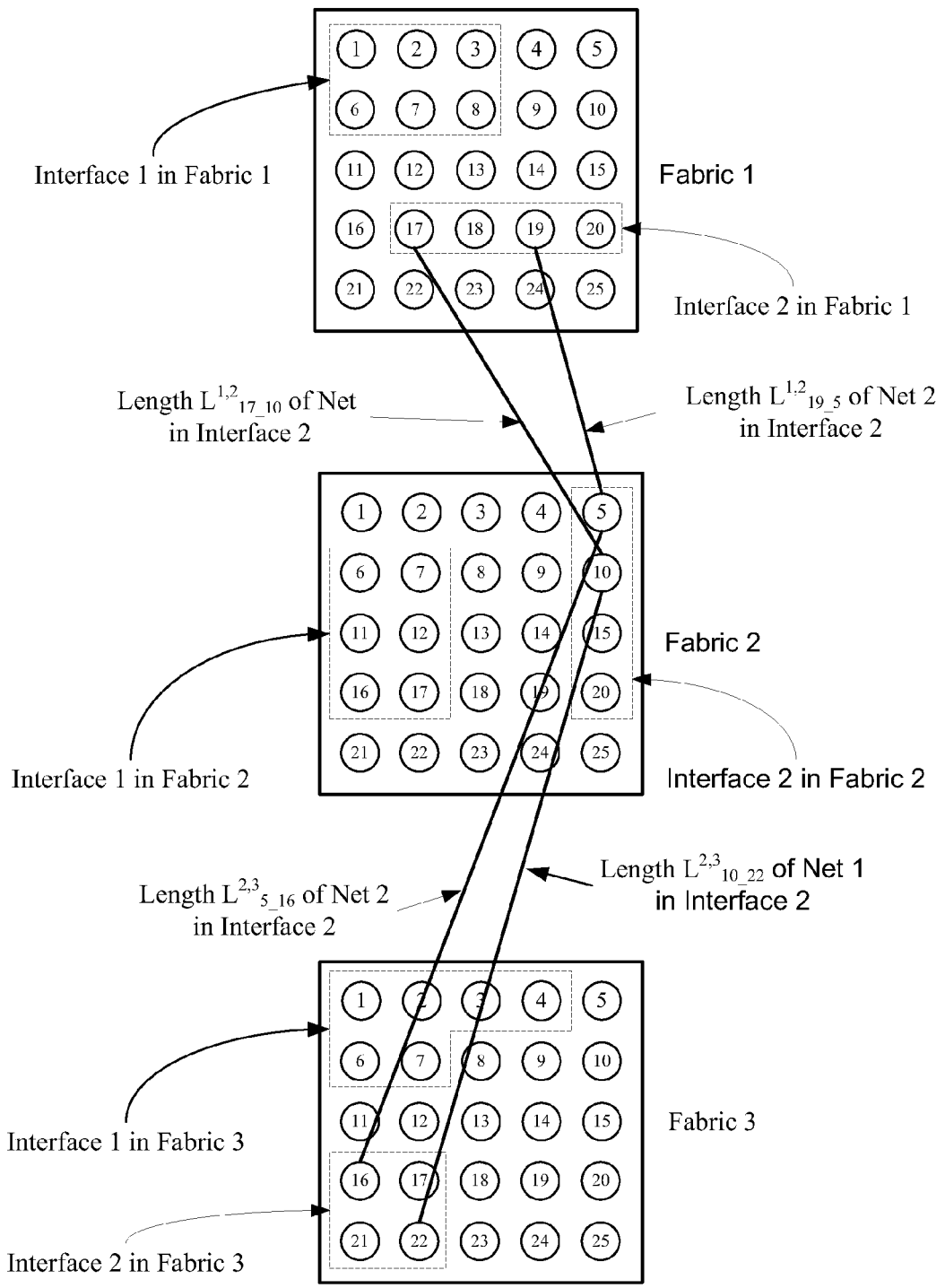
FIG. 9 illustrates an exemplary assignment of nets in an interface to connection points across a plurality of fabrics in accordance with an exemplary embodiment of the invention.

FIG. 9 illustrates an exemplary assignment of nets in an interface to connection points across a plurality of fabrics in accordance with an embodiment of the invention. Referring to FIG. 3 and FIG. 9, the interface nets are assigned across fabrics at stage 400 based on the locations of connection points outputted at block 340 of FIG. 5 for each interface in each of the fabrics. For example, the first net in interface 1 can be assigned to connection points 1, 6 and 1 in fabrics 1, 2 and 3, respectively. A second net in interface 1 can be assigned to connection points 2, 7 and 2 in fabrics 1, 2 and 3, respectively. Similarly, a fourth net in interface 1 can be assigned to connection points 6, 12 and 4 in fabrics 1, 2 and 3, respectively.

Figure 10:
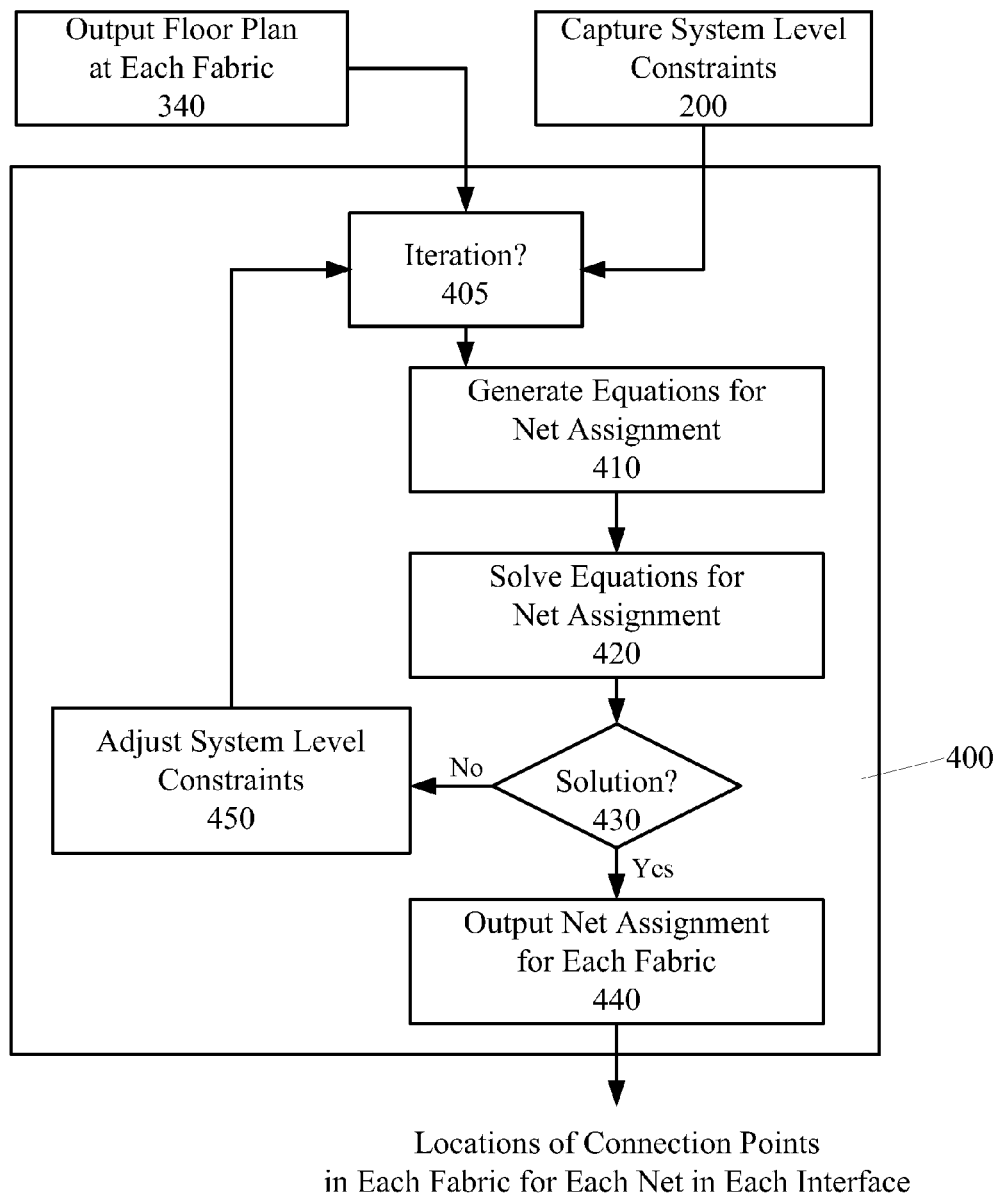
FIG. 10 shows a chart illustrating an exemplary design flow for assigning each connection points in an interface to a net of the interface across multiple fabrics according to an exemplary embodiment of the invention.

FIG. 10 shows a chart illustrating an exemplary design flow for assigning each connection points in an interface to a net of the interface across multiple fabrics according to an exemplary embodiment of the invention. Referring to FIG. 10, the system level constraints generated at stage 200 of FIG. 4 and the locations of the connection points assigned to each interface at block 340 of FIG. 5 are read from a data exchange file or from memory. At a first iteration 405 during net assignment, the system level constraints are expressed as a set of equations and inequalities describing the assignment of nets to the connection points in each interface in each fabric at block 410. At block 420, the equations and inequalities describing the assignment of interfaces are solved using optimization equation solvers. At block 430, the results generated by the optimization equation solver are verified.

If the generated results from block 420 represent a valid solution that satisfies all the system level constraints, the net assignment is outputted for each fabric at block 440. For example, the assignment information including which connection points from a first fabric is to be connected to which connection point in a second fabric to form a net is stored in a database. Accordingly, the net assignment information is accessible to multiple design teams. Thus, individual design teams can use the net assignment information across the fabrics to perform routing between fabrics.

In an exemplary embodiment of the invention, an additional iteration through blocks 410 and 420 may be performed to obtain a valid solution that satisfies all the system level constraints. For example, if the generated results from block 420 do not constitute a valid solution, the system level constraints are adjusted at block 450, the number of iteration is adjusted at block 405 and another iteration is performed to generate equations for the adjusted system level constraints based on the connection points previously assigned to each interface. Then, the newly generated equations are solved at block 420 to obtain a valid solution for the net assignment across the multiple fabrics. The adjustment of system level constraints at block 450 and the iteration through blocks 410 and 420 can be repeated until a valid solution at block 430.

Still referring to FIG. 10, each of the nets in an interface is assigned to one of the connectors previously assigned to that interface in each of the fabrics at block 340 of FIG. 5 based on the system level constraints generated block 300 in FIG. 4 above and based on the locations of the connection points assigned to each interface at block 340 of FIG. 5 above. In the design flow, additional equations can be generated at block 410 based on additional conditions to be satisfied by the nets in the I-numbered interface. The system level constraints on the net assignments can be expressed by equations similar with Equations 1-22 above in relation to the boolean variables P, S and T.

An example of a condition on net assignment across multiple fabrics is that each of the connection points assigned to an I-numbered interface in one of the fabrics must be connected to one and exactly one connection point in a subsequent fabric.

Another example of a condition on net assignment across multiple fabrics is that none of the connection points assigned to an I-numbered interface in one of the fabrics should be connected to more than one connection point of its lower level fabric.

A third example of a condition on net assignment across multiple fabric is that a net in an interface be assigned to the same interface across all fabrics.

A fourth example of a condition on net assignment across multiple fabrics is that differential pair constraint be satisfied.

A fifth example of a condition on net assignment across multiple fabrics is that timing constraints, such as propagation delays in a net, be met.

Referring back to FIG. 9, a first exemplary net 1 in interface 2 goes from connection point 17 in fabric 1, through connection point 10 in fabric 2 to connection point 22 in fabric 3. A second exemplary net 2 in interface 2 goes from connection point 19 in fabric 1, through connection point 5 in fabric 2 to connection point 16 in fabric 3. A total length of net 1 across all three fabrics 1-3 is the sum of the length $L^{1,2}_{17\_10}$ and $L^{2,3}_{10\_22}$ of the interconnection between fabric 1 and fabric 2 and between fabric 2 and fabric 3, respectively. A total length of net 2 across all three fabrics 1-3 is the sum of the length $L^{1,2}_{19\_5}$ and $L^{2,3}_{5\_16}$ of the interconnection between fabric 1 and fabric 2 and between fabric 2 and fabric 3, respectively. A similar length can be attributed to each net in interface 2.

Referring back to FIG. 10, In an exemplary embodiment of the invention, the one or more equations generated at block 410 are solved at block 420 to find an optimum assignment of connection points across the fabrics to the I-numbered interfaces so that the length of each of the I-numbered interfaces is less than a maximum interface length $M_I$ for interface I, as specified through the system level constraints in FIG. 4 above. In another exemplary embodiment, the optimum assignment is performed at block 420 such that a representative length of the I-numbered interfaces is minimum across all possible assignments of the connection points to the individual interfaces. The representative length of the interfaces can be, for example, any of the sum of the lengths of the individual I-numbered interfaces, the arithmetic average of the lengths of the individual I-numbered interfaces, and the maximum of the lengths of the individual I-numbered interfaces.

In an exemplary embodiment, the optimization criterion relating to the length of one or more of the nets in an interface can be expressed by one of Equations 21 and 22, or a similarly generated equation. Thus, the assignment of the optimal net includes solving a plurality of equations, such as pseudo-boolean equations, subject to the optimization criterion expressed by one of Equations 22 and 23.

In another exemplary embodiment, the optimization criterion relating to the length of all the nets in all interfaces can be expressed by adding summation terms to Equation 23 to account for all of the nets for all of the interfaces. Thus, the assignment of the optimal net includes solving a plurality of equations, such as pseudo-boolean equations, subject to the optimization criterion expressed by Equation 23 or a similarly generated equation.

After solving the equations at block 420, if a valid solution was found as indicated at a verification step 430, the optimum net assignment is outputted at block 440 to assign each of the i-numbered connection points associated with an I-numbered interface in the first fabric 1 with a corresponding j-numbered connection point in the second fabric 2 to form a net in the I-numbered interface from the first fabric 1 to the second fabric 2 based on system level constraints or conditions to be satisfied by the nets in the I-numbered interface.

At the completion of the net assignment stage at block 440, connection information will be generated for each net in an interface including, for example, the connection point assigned to the net in the first fabric, the connection point assigned to the net in the second fabric and the connection point assigned to the net in the third fabric. Thus, the net assignment stage 400 from FIG. 3 specifies which connection point in the first fabric is to be connected to which connection point in the second fabric, and which connection point from the second fabric is to be connected to which connection point in the third fabric.

Referring back to FIG. 3, after assigning connection points to each interface in each fabric at block 300 and assigning the nets in each interface to corresponding connection points across the fabrics at block 400, each of the nets in each interface is routed across the fabrics at block 500 to connect the connection point assigned to the net in the first fabric to the connection point assigned to the net in the second fabric and to the connection point assigned to the net in the third fabric. The routing can be performed using fabric specific router based on the system level constraints including the routing constraints specified in FIG. 4 above.

The methods described above can be implemented on a computer system to automate the assignment of interfaces and nets across multiple fabrics in a distributed design environment. For example, the methods can be implemented as a computer program including a set of instructions written in a high level programming language executable on a computer or a computer system. The computer program can be provided in a computer readable medium that can be read by a computer or computer system to be loaded into an internal memory (e.g. RAM) of the computer or computer system. Then, one or more processor of the computer or computer system can execute the program loaded into the internal memory thereof to perform the tasks described in reference to FIGS. 3, 4, 5 and 10 above.

Figure 11:
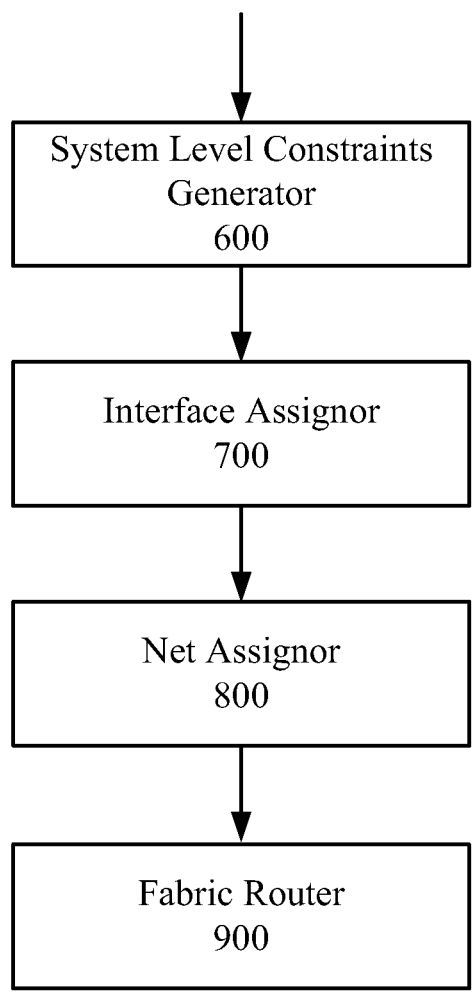
FIG. 11 is a block diagram illustrating an exemplary system for automatically assigning interfaces across multiple fabrics of an electronic system according to an embodiment of the invention.

FIG. 11 is a block diagram illustrating an exemplary system for automatically assigning interfaces across multiple fabrics of an electronic system according to an embodiment of the invention. Referring to FIG. 11, a system for designing an electronic system includes a system level constraint generator 600 for capturing system level constraints, an interface assignor 700 for assigning connection points in each fabric to each interface, a net assignor 800 for assigning the nets in each interface to corresponding connection points in each fabric, and a fabric router 900 for routing the nets in each interface across the fabrics. Any of the system level constraints generator 600, the interface assignor 700, net assignor 800 and the fabric router 900 can be implemented as a software module residing on a corresponding computing system. The constraints generator 600, the interface assignor 700, the net assignor 800 and the fabric router 900 can communicate with each other through a system bus if they are all on the same computer system or through an interconnection network, for example a local area network (LAN) or a wide area network (WAN), if any of the components are distributed geographically.

Figure 12:
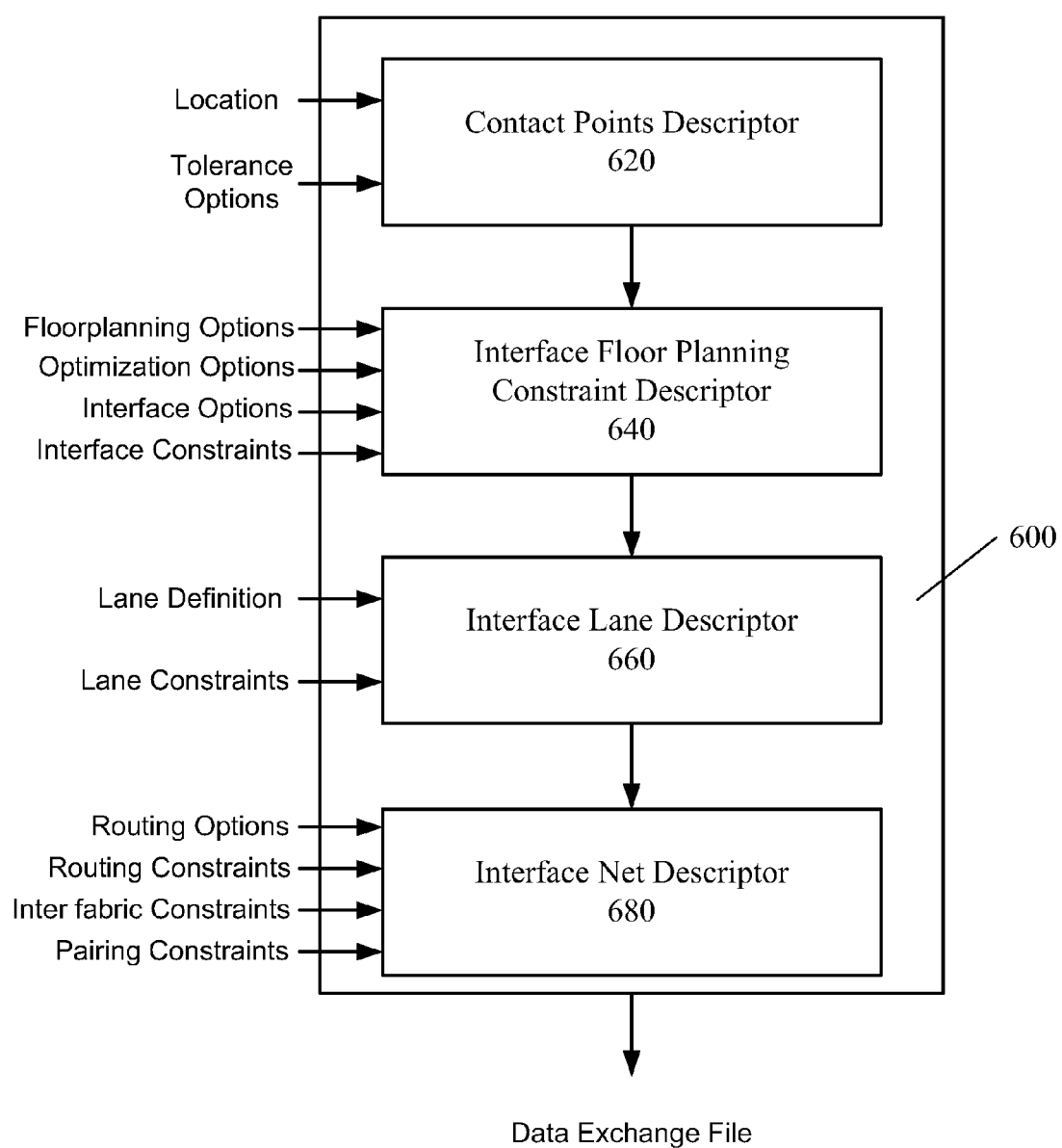
FIG. 12 shows a block diagram illustration of the system level constraints generator according to an embodiment of the invention.

FIG. 12 shows a block diagram illustration of the system level constraints generator according to an embodiment of the invention. Referring to FIG. 12, the system level constraints generator 600 includes a contact point descriptor responsive to input data such as location and tolerance options for the contact points provided, for example, through a GUI to specify the locations of connection points in each fabric. In an embodiment, the contact points descriptor a computer software module implementing block 220 from FIG. 4 above. For example, the computer module implementing block 220 causes the computer system to gather data inputted by a user via a GUI or provided through a data file, e.g. an XML file, to represent the locations of connection points in each fabric at the first stage 220. The user may also input a tolerance value for each of the coordinates.

The system level constraints generator 600 also includes an interface floor planning constraint descriptor 640 responsive to input data such as floor planning options, optimization options, interface options and interface constraints to capture constraints on interface floor planning. In an embodiment, the contact point descriptor 640 includes a computer software module implementing block 240 from FIG. 4 above. Specifically, the computer module implementing block 240 includes a set of instructions which, when loaded into the internal memory of the computer system and executed by the computer system, causes the computer system to gather data provided by the user or in a data file listing, at the second stage 240, a plurality of interface options to specify a style for the interface floorplan at one or more of the fabrics 141, 161 and 181, such as conditions on the location of the contact points for the interface in one or more of the fabrics 141, 161 and 181.

The system level constraints generator 600 may also include an interface lane descriptor 660 responsive to input data such as lane definition and lane constraints to define lanes within each interface. In an embodiment, the interface lane descriptor 660 includes a computer software module implementing block 260 from FIG. 4 above. For example, the computer module implementing block 260 includes a set of instructions which, when loaded into the internal memory of the computer system and executed by the computer system, causes the computer system to gather data provided by the user or in a data file defusing lanes within each interface.

The system level constraints generator 600 further include an interface net descriptor 680 responsive to input data such as routing options, routing constraints, inter fabric constraints and pairing constraints to capture constraints on interface net assignment across fabrics. In an embodiment, the interface net descriptor 680 includes a computer software module implementing block 280 from FIG. 4 above. For example, the computer module implementing block 280 includes a set of instructions which, when loaded into the internal memory of the computer system and executed by the computer system, causes the computer system to gather data provided by the user or in a data file, to represent constraints on interface net assignment across fabrics, including a selected solution optimization for the interface nets.

The computer module implementing one or more of blocks 220, 240, 260 and 280 includes a set of instructions causing the computer system to generate a data exchange file and stored the data exchanged in a storage means on the computer system, such as a hard disk, a floppy disk, a USB disk or a USB memory. This allows various design teams to access the same system level constraints when designing a part of the electronic system. An example of a data exchange file generated by the system level constraints generator 600 is an extensible markup language (XML) file incorporating tags and associated values for the system level constraints.

Figure 13:
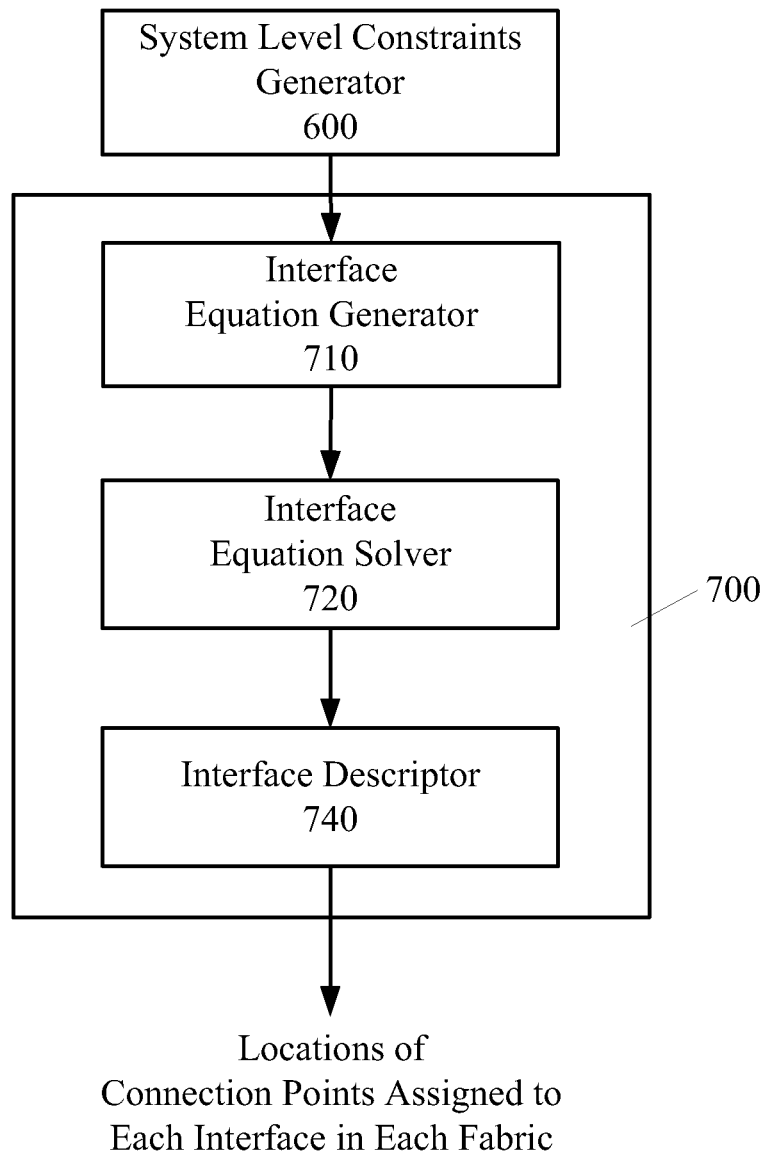
FIG. 13 shows a block diagram illustrating an exemplary interface assignor according to an embodiment of the invention.

FIG. 13 shows a block diagram illustrating an exemplary interface assignor according to an embodiment of the invention. Referring to FIG. 13, the interface assignor 700 include a computer software module implementing blocks 310, 320, 330, 340 and 350 as described in reference to FIG. 5 above.

For example, the interface assignor 700 includes an interface equation generator 710, an interface equation solver 720 and an interface descriptor 740. The interface equation generator 710 inputs the system level constraints generated by the system level constraints generator 600 and converts the constraints corresponding to interface assignment to a corresponding set of equations. For example, the interface equation generator 710 may include a computer software module implementing block 310 of FIG. 5 to generate Equations 1-3, 5-17 and 19-21 as described above. The computer software module implementing block 310 includes instructions that cause the computer system to process the system level constraints received from the user to convert them to a set of equations, such as Equations 1-3, 5-17 and 19-21, representing the interface assignment.

The interface equation solver 720 solves the pseudo-boolean equations in Equations 1-3, 5-17 and 19-21 using a pseudo-boolean equation solver. In an exemplary embodiment of the invention, the interface equation solver 720 minimizes a representative length of the interfaces subject to the constraints expressed by Equations 1-3, 5-17 and 19-21. The interface equation solver 720 also verifies that the solution provided by the pseudo-boolean equation solver. A computer module implementing the interface equation solver 720 includes a set of equation solving instructions that cause the computer system to solve the pseudo-boolean equations to minimize the length of the interfaces subject to the constraints expressed by Equations 1-3, 5-17 and 19-21.

The interface descriptor 740 outputs the interface floorplan corresponding to the solution generated by the interface equation solver 720 for each fabric at block 340. The interface descriptor 740 can be implemented by a computer software module that cause the computer system to output the interface floor plan to memory area of the computer system or as a data file, e.g. an XML data file saved on a drive attached to the computer system or accessible on a network.

According to an exemplary embodiment of the invention, a system for connecting interfaces to a plurality of fabrics includes an interface equation generator 710 that generates one or more of Equations 1-3, 5-17 and 19-21 to represent in a formal manner system level constraints relating to the assignment of connection points to each interface and to the assignment of net from each interface to corresponding connection points in each fabric. The system includes an interface equation solver 720 that solves the one or more of Equations 1-3, 5-17 and 19-20 to assign each of the interfaces to a corresponding plurality of the connection points in each of the fabrics in accordance with the one or more system level constraints on the assignment of interfaces formulated by the equations. The interface equation solver 720 may use a pseudo-boolean equation solver to solve the one or more of Equations 1-3, 5-17 and 19-21. The system may also include an interface descriptor 740 to specify the locations of the connection points assigned to each interface in each of the fabrics in a desired format.

According to another exemplary embodiment of the invention, the system for connecting interfaces to a plurality of fabrics includes an interface equation solver 720 that solves the one or more of Equations 1-3, 5-17 and 19-21 in accordance with desired system level constraints on the assignment of interfaces subject to an optimization criterion. For example, the equation solver 721 may solve the one or more of Equations 1-3, 5-17 and 19-21 to minimize the total length of the interfaces subject to the constraints expressed by the one or more of Equations 1-3, 5-17 and 19-21. In another example, the interface equation solver 720 may solve the one or more of Equations 1-3, 5-17 and 19-21 to minimize an etch length of one or more of the interfaces subject to the constraints expressed by the one or more of Equations 1-3, 5-17 and 19-21. In a further example, the interface equation solver 720 may solve the one or more of Equations 1-3, 5-17 and 19-21 to minimize a propagation delay from any connection point in one or more of the interfaces in the first fabric to any connection point in the interface in the second fabric, and possibly to any connection point in the interface in the third fabric, subject to the constraints expressed by the one or more of Equations 1-3, 5-17 and 19-21.

Referring back to FIG. 11, the net assignor 800 in the system assigns the interface nets across the fabrics based on the locations of interface contact points outputted by the interface assignor 700. In an embodiment, the nets in each interface are assigned to connection points located in the same relative order as the connections points assigned to the interface in each fabric. For example, referring to FIG. 9, the net assignor 800 assigns the first net in interface 1 to connection points 1, 6 and 1 in fabrics 1, 2 and 3, respectively. The net assignor 800 assigns a second net in interface 1 to connection points 2, 7 and 2 in fabrics 1, 2 and 3, respectively. Using the same pattern, the net assignor 800 assigns a fourth net in interface 1 to connection points 6, 12 and 4 in fabrics 1, 2 and 3, respectively.

Figure 14:
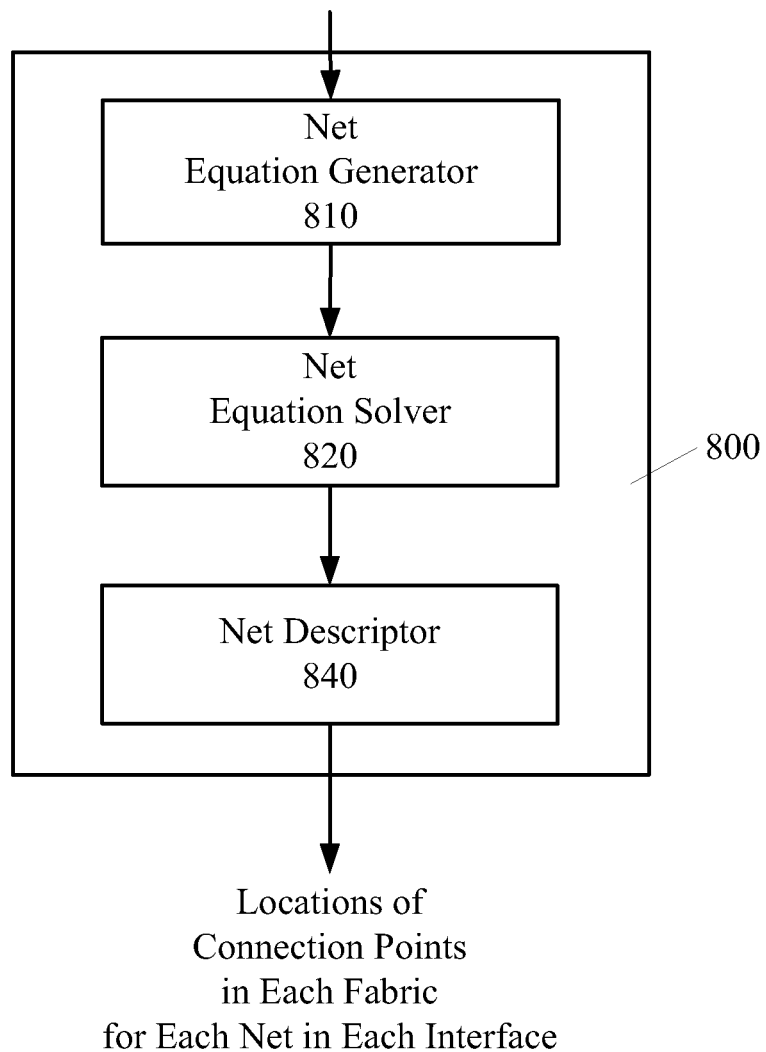
FIG. 14 shows a block diagram illustrating a net assignor according to an exemplary embodiment of the invention.

FIG. 14 shows a block diagram illustrating a net assignor according to an exemplary embodiment of the invention. Referring to FIG. 14, the net assignor 800 includes a net equation generator 810 that generates one or more equations to represent system level constraints or condition relating to which of the i-numbered connection points associated with an I-numbered interface in the first fabric 1 can be connected to which corresponding j-numbered connection point in the second fabric 2 for form a net in the I-numbered interface. The net equation generator 810 generates one or more equations in the form of Equations 1-3, 5-17 and 19-22 above.

The net assignor 800 includes a net equation solver 820 that solves the generated equations 1-3, 5-17 and 19-21 to find an optimum assignment of connection points across the fabrics to the I-numbered interfaces for which the length of each of the I-numbered interfaces is less than a maximum interface length $M_I$ for interface I, as specified through the system level constraints. In another exemplary embodiment, the net equation solver 820 finds the optimum assignment for which a representative length of the I-numbered interfaces is minimum across all possible assignments of the connection points to the individual interfaces. The representative length of the interfaces can be, for example, any of the sum of the lengths of the individual I-numbered interfaces, the arithmetic average of the lengths of the individual I-numbered interfaces, and the maximum of the lengths of the individual I-numbered interfaces.

The net assignor 800 further includes a net descriptor 840 that generates connection information for each net in an interface including, for example, the connection point assigned to the net in the first fabric, the connection point assigned to the net in the second fabric and the connection point assigned to the net in the third fabric. Thus, the net descriptor 840 specifies which connection point in the first fabric is to be connected to which connection point in the second fabric, and which connection point from the second fabric is to be connected to which connection point in the third fabric.

The net assignor 800 can be implemented as one or more computer module to be loaded into the memory of the computer system and executed by one or more processor of the computer system to perform the functions described above in reference to the net assignor 800. For example, a computer module for the net equation generator 810 causes the computer system to generate one or more equations in the form of Equations 1-3, 5-17 and 19-22 above. A computer module for the net equation solver 820 causes the computer system to solve the generated equations 1-3, 5-17 and 19-21 to find an optimum assignment of connection points across the fabrics to the I-numbered interfaces for which the length of each of the I-numbered interfaces is less than a maximum interface length MI for interface I, as specified through the system level constraints. A computer module for the net descriptor 840 causes the computer system to generate connection information for each net in an interface including, for example, the connection point assigned to the net in the first fabric, the connection point assigned to the net in the second fabric and the connection point assigned to the net in the third fabric.

Referring back to FIG. 11, the system includes a fabric router 900 that routes each of the nets in each interface across the fabrics to connect the connection point assigned to the net in the first fabric to the connection point assigned to the net in the second fabric and to the connection point assigned to the net in the third fabric. The fabric router 900 includes fabric specific router that performs the routing in the individual fabrics based on the system level constraints including the routing constraints specified in FIG. 12 above. The fabric router may include one or more software module, which can be loaded into the memory of the computer system to cause the computer to route each of the nets in each interface across the fabrics to connect the connection point assigned to the net in the first fabric to the connection point assigned to the net in the second fabric and to the connection point assigned to the net in the third fabric.

Thus, according to an exemplary embodiment of the invention, the net assignor 800 assigns each of the plurality of nets in each of the plurality of interfaces to one of the corresponding plurality of the connectors in each of the fabrics.

According to an exemplary embodiment of the invention, the system level constraints are incorporated into a data exchange file readable by a computer, accessible across a computer network, or distributable to various computers by portable means, such as a portable disk or a portable memory. Accordingly, various design teams can independently access the same system level constraints when designing a part of the electronic system.

According to an exemplary embodiment of the invention, the locations of the contact points corresponding to each selected one of the interfaces in each fabric are stored in a database accessible to multiple design teams. Thus, individual design teams can independently use the interface assignment information relevant to a selected one of the fabrics to complete the design of the selected fabric.

It will be apparent to those skilled in the art that various modifications and variations can be made in embodiments of the method and system for specifying system level constraints in a cross-fabric design environment without departing from the spirit or scope of the invention. Thus, it is intended that the invention cover the modifications and variations of the embodiments of this invention provided they come within the scope of the appended claims and their equivalents.

What is claimed is:

1. A method of specifying system level constraints for connecting an interface between first and second fabrics of an electronic device, the interface having a net to be connected from one connector in the first fabric to a second connector in the second fabric, the connectors being defined by their respective location within the corresponding one of the first and second fabrics, the method comprising:

specifying, using one or more processors, one or more first condition relating to a placement of the interface within one of the first and second fabrics;

specifying, using one or more processors, one or more second condition relating to a connection of the net in the interface between the first and second fabrics;

generating, using one or more processors, one or more first equation expressing the first condition as a function of the location of the connectors within the one of the first and second fabrics;

generating, using one or more processors, one or more second equation expressing the second condition as a function of the location of connectors within the one of the first and second fabrics;

generating, using one or more processors, one or more third equation expressing an optimality criterion for the interface; and outputting, using one or more processors, the one or more first equation, the one or more second equation and the one or more third equation to a data file in a computer readable format.

2. The method of claim 1, wherein generating the one or more first equation includes associating with each of the connectors in one or more of the first and second fabrics a first variable indicating that the connector belongs to the interface.

3. The method of claim 1, wherein the one or more first equation expresses that each connector in the interface within one of the first and second fabrics is one of horizontally or vertically adjacent to another connector in the interface within the one of the first and second fabrics.

4. The method of claim 1, wherein the one or more first equation expresses that at least one diagonal and one non-diagonal connectors are selected in a 3×3 portion of one of the first and second fabrics.

5. The method of claim 1, wherein the one or more first equation expresses that exactly one diagonal and no more than two non-diagonal connectors are selected in a 3×3 portion of one of the first and second fabrics.

6. The method of claim 1, wherein the one or more first equation expresses that the sum of a first variable evaluated at respective ones of the first and second connectors in the interface in one of the first and second fabrics is equal to the number of the connectors in the interface in the one of the first and second fabrics.

7. The method of claim 6, wherein the generating of the one or more first equation includes associating with each of the connectors in one or more of the fabrics a second variable indicating that each of the connectors has no higher numbered adjacent connector in the interface within the one or more of the first and second fabrics.

8. The method of claim 6, wherein the generating of the one or more first equation includes associating with each of the connectors in one or more of the fabrics a second variable indicating that exactly one connector has no higher numbered adjacent connector in the interface within the one or more of the first and second fabrics.

9. The method of claim 1, wherein the optimality criterion includes one of minimizing a length of one or more of the nets and minimizing a voltage drop across one or more of the nets.

10. The method of claim 1, wherein the second condition includes a propagation delay between the first and second fabrics.

11. The method of claim 1, wherein the one or more second equation expresses that a length of each of the first and second nets in the interface is less than a maximum interface length.

12. A system for specifying system level constraints for connecting an interface between first and second fabrics of an electronic device, the interface having a net to be connected from one connector in the first fabric to a second connector in the second fabric, the connectors being defined by their respective location within the corresponding one of the first and second fabrics, the system comprising:

a first descriptor that specifies one or more first condition relating to a placement of the interface within one of the first and second fabrics;

a second descriptor that specifies one or more second condition relating to a connection of the net in the interface between the first and second fabrics; and one or more processors configured to execute an equation generator module that generates one or more first equation expressing the first condition as a function of the location of the connectors within the one of the first and second fabrics, one or more second equation expressing the second condition as a function of the location of connectors within the one of the first and second fabrics and one or more third equation expressing an optimality criterion for the interface.

13. The system of claim 12, further comprising a data exchanger that outputs the one or more first equation, the one or more second equation and the one or more third equation to a data file in a computer readable format.

14. The system of claim 12, wherein the one or more first equation associates with each of the connectors in one or more of the first and second fabrics a first variable indicating that the connector belongs to the interface.

15. The system of claim 12, wherein the one or more first equation expresses that each connector in the interface within one of the first and second fabrics is one of horizontally or vertically adjacent to another connector in the interface within the one of the first and second fabrics.

16. The system of claim 12, wherein the one or more first equation expresses that at least one diagonally adjacent connector and one non-diagonally adjacent connector are selected in one of the first and second fabrics.

17. The system of claim 12, wherein the one or more first equation expresses that exactly one diagonally adjacent and no more than two non-diagonally adjacent connectors are selected in one of the first and second fabrics.

18. The system of claim 12, wherein the one or more first equation expresses that the sum of a first variable evaluated at respective ones of the first and second connectors in the interface in one of the first and second fabrics is equal to the number of the nets in the interface in the one of the first and second fabrics.

19. The system of claim 12, wherein the one or more first equation associates with each of the connectors in one or more of the fabrics a second variable indicating that the connector has no higher numbered adjacent connector in the interface within the one or more of the first and second fabrics.

20. The system of claim 12, wherein the optimality criterion includes one of minimizing a length of one or more of the nets and minimizing a voltage drop across one or more of the nets.

21. The system of claim 12, wherein the second condition includes a propagation delay between the first and second fabrics.

22. The system of claim 12, wherein the one or more second equation expresses that a length of each of the first and second nets in the interface is less than a maximum interface length.

23. A non-transitory computer readable medium storing a set of instructions which, when executed by a computer processing system, causes the computer processing system to process input data representing locations of connectors of an interface of an electronic device to specify system level constraints for connecting a net of the interface from one connector in the first fabric to a second connector in the second fabric, the set of instructions comprising:

a first descriptor module that cause the computer system to input one or more first condition relating to a placement of the interface within one of the first and second fabrics;

a second descriptor module that causes the computer system to input one or more second condition relating to a connection of the net in the interface between the first and second fabrics;

an equation generator module that causes the computer system to generate one or more first equation expressing the first condition as a function of the location of the connectors within the one of the first and second fabrics, one or more second equation expressing the second condition as a function of the location of connectors within the one of the first and second fabrics and one or more third equation expressing an optimality criterion for the interface; and a data exchanger module that outputs the one or more first equation, the one or more second equation and the one or more third equation to a data file.

24. The computer readable medium of claim 23, wherein the one or more first equation associates with each of the connectors in one or more of the first and second fabrics a first variable indicating that the connector belongs to the interface.

25. The computer readable medium of claim 23, wherein the one or more first equation expresses that each connector in the interface within one of the first and second fabrics is one of horizontally or vertically adjacent to another connector in the interface within the one of the first and second fabrics.

26. The computer readable medium of claim 23, wherein the one or more first equation expresses that at least one diagonally adjacent connector and one non-diagonally adjacent connector are selected in one of the first and second fabrics.

27. The computer readable medium of claim 23, wherein the one or more first equation expresses that exactly one diagonally adjacent and no more than two non-diagonally adjacent connectors are selected in one of the first and second fabrics.

28. The computer readable medium of claim 23, wherein the one or more first equation expresses that the sum of a first variable evaluated at respective ones of the first and second connectors in the interface in one of the first and second fabrics is equal to the number of the nets in the interface in the one of the first and second fabrics.

29. The computer readable medium of claim 23, wherein the one or more first equation associates with each of the connectors in one or more of the fabrics a second variable indicating that the connector has no higher numbered adjacent connector in the interface within the one or more of the first and second fabrics.

30. The computer readable medium of claim 23, wherein the optimality criterion includes one of minimizing a length of one or more of the nets and minimizing a voltage drop across one or more of the nets.

31. The computer readable medium of claim 23, wherein the second condition includes a propagation delay between the first and second fabrics.

32. The computer readable medium of claim 23, wherein the one or more second equation expresses that a length of each of the first and second nets in the interface is less than a maximum interface length.

* * * * *